US012058829B2

(12) United States Patent
Moon

(10) Patent No.: US 12,058,829 B2
(45) Date of Patent: Aug. 6, 2024

(54) ELECTRONIC DEVICE COMPRISING GLASS PLATE

(71) Applicant: SAMSUNG ELECTRONICS CO., LTD., Suwon-si (KR)

(72) Inventor: Youngmin Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 308 days.

(21) Appl. No.: 17/553,050

(22) Filed: Dec. 16, 2021

(65) Prior Publication Data

US 2022/0110219 A1 Apr. 7, 2022

Related U.S. Application Data

(63) Continuation of application No. PCT/KR2020/008169, filed on Jun. 23, 2020.

(30) Foreign Application Priority Data

Jul. 1, 2019 (KR) .................. 10-2019-0078728

(51) Int. Cl.
*H05K 5/00* (2006.01)
*G06F 1/16* (2006.01)
(Continued)

(52) U.S. Cl.
CPC ............ *H05K 5/03* (2013.01); *G06F 1/1626* (2013.01); *H04B 1/3888* (2013.01);
(Continued)

(58) Field of Classification Search
None
See application file for complete search history.

(56) References Cited

U.S. PATENT DOCUMENTS 10,527,877 B2 * 1/2020 Ochi .................. H04M 1/0266
10,602,645 B2 * 3/2020 Qi ........................ H05K 9/0054
(Continued)

FOREIGN PATENT DOCUMENTS

JP 2016-006573 1/2016
JP 2017-213881 12/2017
(Continued)

OTHER PUBLICATIONS

Korean Office Action dated Sep. 19, 2023 for KR Application No. 10-2019-0078728.

*Primary Examiner* — Anthony Q Edwards
*Assistant Examiner* — Rashen E Morrison
(74) *Attorney, Agent, or Firm* — Nixon & Vanderhye P.C.

(57) ABSTRACT

An electronic device according to various embodiments of the disclosure may comprise: a housing; and a peripheral portion adjacent to the housing, an opaque layer, a protective layer, and a processed layer, a first glass plate coupled to the housing and defining an inner space therewith. The peripheral portion may comprise: a first surface facing the inner space in a first direction; a second surface extending from the first surface and facing the inner space in a second direction; a third surface extending from the second surface and adjacent to the periphery of the housing in a third direction; a fourth surface extending from the third surface and facing opposite the inner space in a fourth direction; and a fifth surface extending from the fourth surface, substantially parallel to the first surface, and facing opposite the inner space in a fifth direction. The opaque layer may be formed on a first area of the first surface and may be formed so as not to cover a second area between the first area and the second surface, and the protective layer may be formed so that a portion thereof covers a portion of the first surface and the non-transparent layer, and may also be formed so as to prevent and/or reduce shocks caused by contact between (Continued)

the peripheral portion and the periphery of the housing. The processed layer may be formed by surface processing on at least a part of an area of at least one of the second surface, the third surface, and the fourth surface.

19 Claims, 13 Drawing Sheets

(51) Int. Cl.
    *H04B 1/3888*     (2015.01)
    *H04M 1/02*     (2006.01)
    *H04M 1/18*     (2006.01)
    *H05K 5/02*     (2006.01)
    *H05K 5/03*     (2006.01)
(52) U.S. Cl.
    CPC ......... *H04M 1/0202* (2013.01); *H04M 1/185* (2013.01); *H05K 5/0017* (2013.01); *H05K 5/0217* (2013.01)

(56) References Cited

U.S. PATENT DOCUMENTS

| | | | |
|---|---|---|---|
| 10,736,226 B2 * | 8/2020 | Han | ............... H05K 5/0004 |
| 10,775,657 B2 * | 9/2020 | Inoue | ............... G02F 1/133308 |
| 2016/0349798 A1 | 12/2016 | Park | |
| 2017/0013731 A1 | 1/2017 | Lee et al. | |
| 2017/0341451 A1 | 11/2017 | Minamidate et al. | |
| 2018/0199458 A1 | 7/2018 | Hsu et al. | |
| 2019/0018275 A1 * | 1/2019 | Ochi | ............... G06F 1/1637 |

FOREIGN PATENT DOCUMENTS

| | | |
|---|---|---|
| KR | 10-2012-0074229 | 7/2012 |
| KR | 10-1688021 | 12/2016 |
| KR | 10-2017-0005750 | 1/2017 |

* cited by examiner

US 12,058,829 B2

ELECTRONIC DEVICE COMPRISING GLASS PLATE

CROSS-REFERENCE TO RELATED APPLICATIONS

This application is a continuation of International Application No. PCT/KR2020/008169 designating the United States, filed on Jun. 23, 2020, in the Korean Intellectual Property Receiving Office and claiming priority to Korean Patent Application No. 10-2019-0078728, filed on Jul. 1, 2019, in the Korean Intellectual Property Office, the disclosures of which are incorporated by reference herein in their entireties.

BACKGROUND

Field

The disclosure relates to an electronic device including a glass plate having a curved surface.

Description of Related Art

Due to the remarkable development of information communication technology, semiconductor technology, and the like, the distribution and use of various electronic devices are rapidly increasing. In particular, recent electronic devices are being developed such that users are capable of communicating with each other while carrying the electronic devices.

An electronic device refers to a device that performs a specific function according to a program equipped therein, such as an electronic scheduler, a portable multimedia player, a mobile communication terminal, a tablet PC, an image/sound device, a desktop/laptop PC, or a vehicle navigation system, as well as a home appliance. The above-mentioned electronic devices may output, for example, information stored therein as sound or an image. As the degree of integration of electronic devices has increased and super-high-speed and large-capacity wireless communication has become popular, multiple functions have recently come to be provided in a single electronic device, such as a mobile communication terminal. For example, various functions, such as an entertainment function (e.g., a game function), a multimedia function (e.g., a music/video reproducing function), a communication and security function for mobile banking or the like, a schedule management function, and an e-wallet function, in addition to a communication function, have come to be integrated in a single electronic device. Such an electronic device has been miniaturized so that a user can conveniently carry the electronic device.

With this diversification, housings and/or display devices that cover electronic devices are changing to have various shapes and functions. For example, a front cover that covers a display panel of a display device or a rear cover that covers the rear surface of the electronic device may implement a structure extending to a side surface of the electronic device, thereby providing a user with a sense of beauty.

In general, the configuration of a glass plate that covers the front surface and/or the rear surface of an electronic device generally includes a curved portion. Therefore, a light leakage phenomenon may occur in an end region of the glass plate. For example, since the opposite ends of the glass plate are curved portions which are bent inward, light emitted from the display may be totally reflected inside the glass plate, and a light leakage phenomenon may occur at the opposite ends of the glass plate, which are exposed to the outside.

When the end regions are coated with a printed layer in order to prevent the light leakage phenomenon, printing contamination may occur due to ink overflow to the front surface of the glass plate. Also, the ink overflow may contaminate a jig that supports the glass plate. As another example, since the curved portions of the glass plate are disposed to face the peripheral portion of the housing with a gap interposed therebetween, the housing made of a metal material having a high material strength and the plate made of a glass material may collide with each other when an external impact is applied thereto, so the glass plate may be damaged.

SUMMARY

Embodiments of the disclosure provide an electronic device including a glass plate on which a protective layer and/or a processed layer on an end region of the glass plate is disposed, thereby making it possible to suppress the light leakage phenomenon of light emitted from the display.

Embodiments of the disclosure provide a layer processed through laser etching or sand blasting in an end region of the glass plate, making it possible to prevent and/or reduce an ink overflow phenomenon and/or jig contamination occurring during the coating of an ink layer.

Embodiments of the disclosure provide an electronic device including a glass plate including a coating on an end region of the glass plate that faces the peripheral portion of the housing to provide a protective layer, making it possible to protect the glass plate that may collide with the housing by an external impact.

An electronic device according to various example embodiments of the disclosure may include: a housing, a first glass plate attached to the housing to define an internal space together with the housing, an opaque layer, a protective layer, and a processed layer. The first glass plate may include a peripheral portion adjacent to the housing, wherein the peripheral portion may include a first surface facing the internal space in a first direction, a second surface extending from the first surface and facing the internal space in a second direction, a third surface extending from the second surface and located adjacent to a periphery of the housing in a third direction, a fourth surface extending from the third surface and facing away from the internal space in a fourth direction, and a fifth surface extending from the fourth surface substantially parallel to the first surface and facing away from the internal space in a fifth direction. The opaque layer is provided on a first region of the first surface to not cover a second region between the second surface and the first region, and at least a part of the protective layer may be provided to cover a part of the first surface and the opaque layer to prevent and/or reduce an impact due to contact between the peripheral portion and the periphery of the housing. The processed layer may be provided through a surface treatment on at least a partial region of at least one of the second surface, the third surface, and the fourth surface.

An electronic device according to various example embodiments of the disclosure may include: a housing, a first glass plate coupled to the housing to define an internal space together with the housing, an opaque layer, a protective layer, and a processed layer. The first glass plate may include a peripheral portion adjacent to the housing, and the peripheral portion may include a first surface facing the interior space, a second surface extending from an end of the first surface forming a first angle relative to the first surface, a third surface extending from an end of the second surface forming a second angle relative to the second surface and located adjacent to the periphery of the housing, a fourth surface extending from an end of the third surface forming a third angle relative to the third surface, and a fifth surface extending from an end of the fourth surface substantially parallel to the first surface and facing away from the internal space. The opaque layer is provided on a first region of the first surface to not cover a second region between the second surface and the first region, and at least a part of the protective layer may be provided to cover a part of the first surface and the opaque layer to prevent and/or reduce an impact due to contact between the peripheral portion and the periphery of the housing. The processed layer may be provided on at least a partial region of at least one of the second surface, the third surface, and the fourth surface.

In the electronic device according to various example embodiments of the disclosure, by coating the end regions of the glass plate with a protective layer and a processed layer, it is possible to prevent and/or reduce a light leakage phenomenon of light emitted from the display.

In the electronic device according to various example embodiments of the disclosure, by coating the end regions of the glass plate with a processed layer that is subjected to a surface treatment, it is possible to improve the strength of the glass plate and to improve color material finishing (CMF) quality.

According to various embodiments of the disclosure, by coating an end region of the glass plate that faces the peripheral portion of the housing with a protective layer, it is possible to protect the glass plate that may collide with the housing by an external impact.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
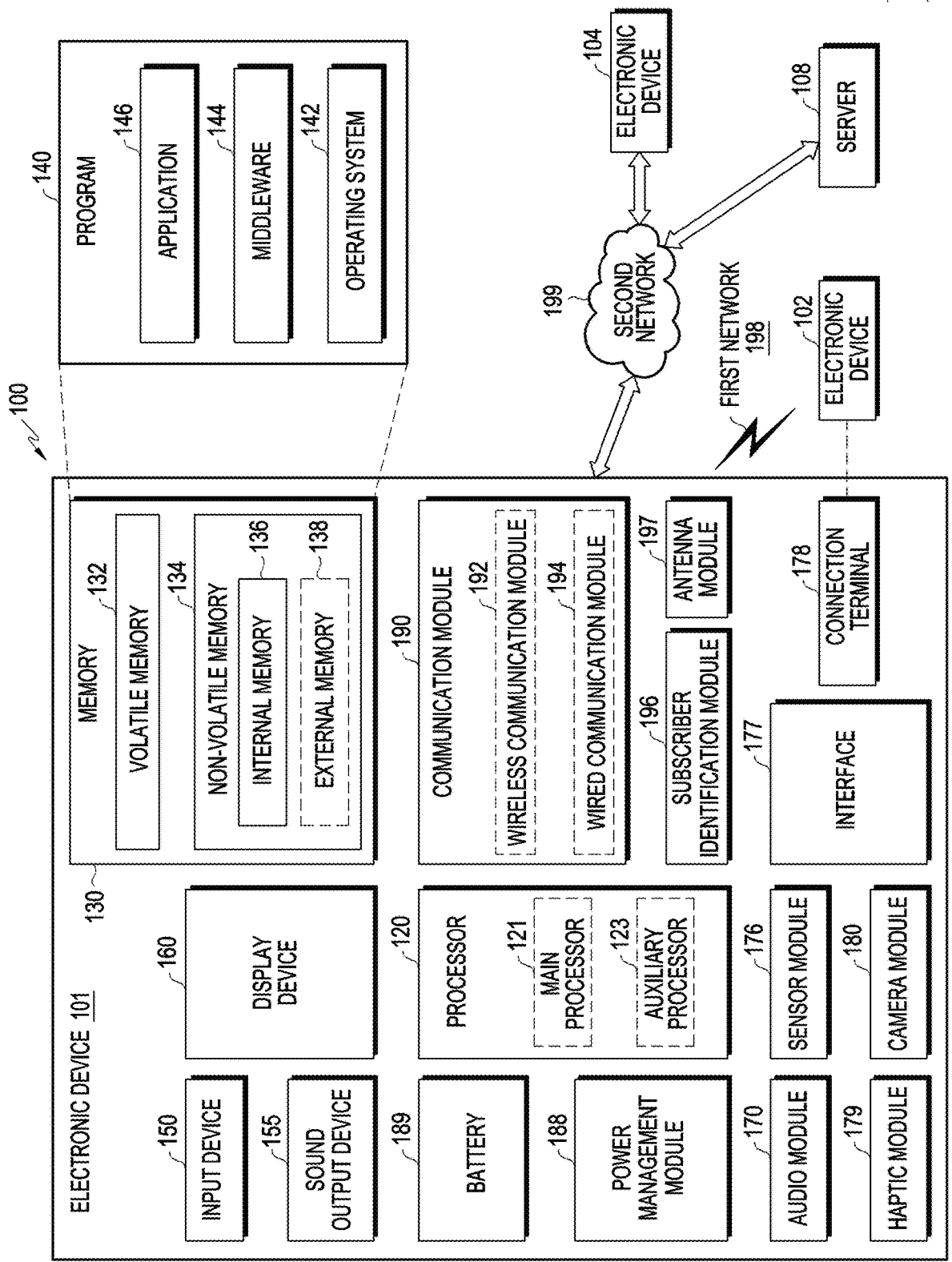
FIG. 1 is a block diagram of illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display device 160 or the camera module 180) of the components may be omitted from the electronic device 101, or one or more other components may be added in the electronic device 101. In various embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to an embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
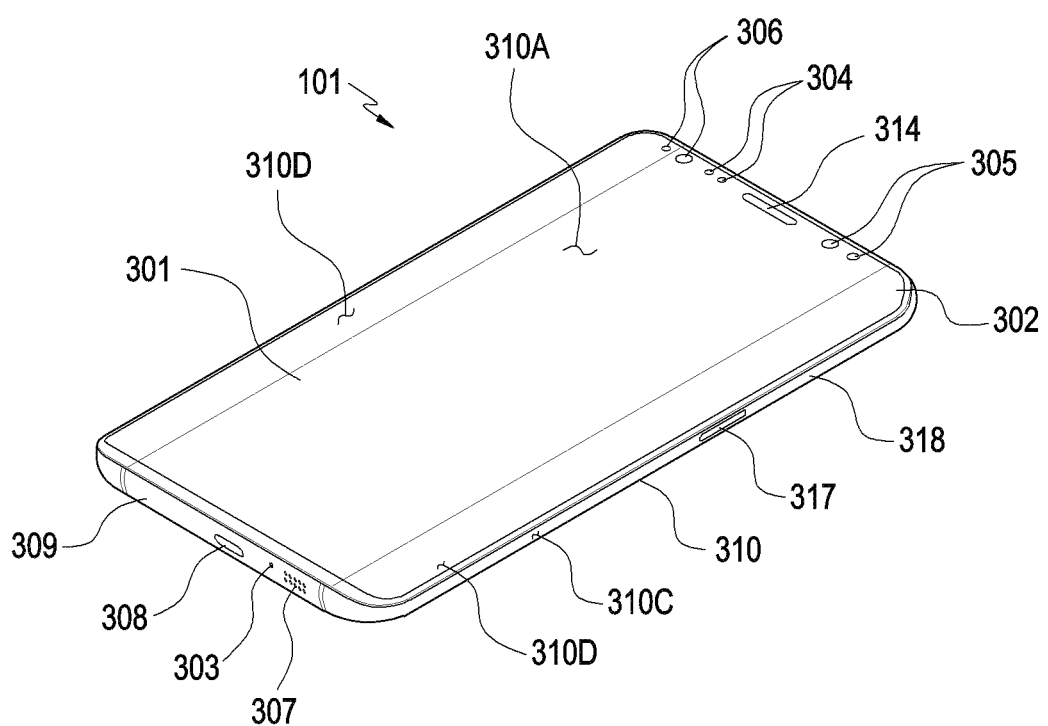
FIG. 2 is a front perspective view illustrating an electronic device according to various embodiments.
Figure 3:
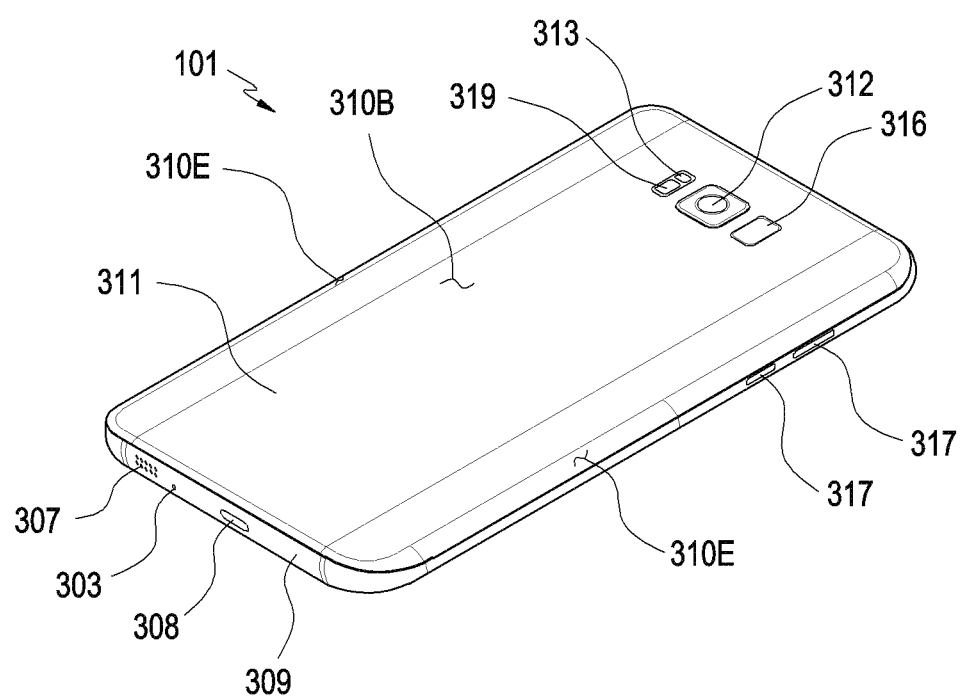
FIG. 3 is a rear perspective view illustrating the electronic device according to various embodiments.

FIG. 2 is a front perspective view illustrating an electronic device 101 according to various embodiments. FIG. 3 is a rear perspective view illustrating the electronic device 101 according to various embodiments.

Referring to FIGS. 2 and 3, the electronic device 101 according to an embodiment may include a housing 310 including a first surface (or a front surface) 310A, a second surface (or a rear surface) 310B, and a side surface 310C surrounding the space between the first surface 310A and the second surface 310B. In an embodiment (not illustrated), the term "housing" may refer to a structure providing some of the first surface 310A, the second surface 310B, and the side surface 310C of FIG. 2. According to an embodiment, at least a part of the first surface 310A may be made of a substantially transparent front plate 302 (e.g., a glass plate or a polymer plate). The second surface 310B may be defined by a substantially opaque rear plate 311. The rear plate 311 may be made of, for example, coated or colored glass, ceramic, a polymer, a metal (e.g., aluminum, stainless steel (STS), or magnesium), or a combination of two or more of these materials. The side surface 310C may be defined by a side bezel structure (or a "side member") 318 coupled to the front plate 302 and the rear plate 311 and including a metal and/or a polymer. In various embodiments, the rear plate 311 and the side bezel structure 318 may be integrally configured, and may include the same material (e.g., a metal material such as aluminum).

In the illustrated embodiment, the front plate 302 may include, at the opposite ends of long edges thereof, two first regions 310D, which are bent from the first surface 310A toward the rear plate 311 and extend seamlessly. In the illustrated embodiment (see FIG. 3), the rear plate 311 may include, at the opposite ends of the long edges thereof, two second regions 310E, which are bent from the second surface 310B toward the front plate 302 and extend seamlessly. In various embodiments, the front plate 302 (or the rear plate 311) may include only one of the first regions 310D (or the second regions 310E). In an embodiment, some of the first regions 310D or the second regions 310E may not be included. In the embodiments described above, when viewed from the side of the electronic device 101, the side bezel structure 318 may have a first thickness (or width) on the side surface portions that do not include the first regions 310D or the second regions 310E described above, and may have a second thickness, which is smaller than the first thickness, on the side surface portions that include the first regions 310D or the second regions 310E.

According to an embodiment, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In various embodiments, at least one of the components (e.g., the key input devices 317 or the light-emitting elements 306) may be omitted from the electronic device 101, or other components may be additionally included in the electronic device 101.

According to an embodiment, the display 301 may be visible or viewable through a substantial portion of, for example, the front plate 302. In various embodiments, at least a part of the display 301 may be visible or viewable through the front plate 302 defining the first surface 310A and the first regions 310D of the side surface 310C. In various embodiments, the edges of the display 301 may be configured to be substantially the same as the shape of the periphery of the front plate 302 adjacent thereto. In an embodiment (not illustrated), the distance between the periphery of the display 301 and the periphery of the front plate 302 may be substantially constant in order to enlarge the visible or viewable area of the display 301.

In an embodiment (not illustrated), recesses or openings may be configured in some portions of the screen display region of the display 301, and one or more of the audio module 314, the sensor modules 304, the camera modules 305, and the light-emitting elements 306, which are aligned with the recesses or the openings, may be included. In an embodiment (not illustrated), the rear surface of the screen display region of the display 301 may include at least one of the audio modules 314, the sensor modules 304, the camera modules 305, the fingerprint sensor 316, and the light-emitting elements 306. In an embodiment (not illustrated), the display 301 may be coupled to or disposed adjacent to a touch-sensitive circuit, a pressure sensor capable of measuring a touch intensity (pressure), and/or a digitizer configured to detect a magnetic-field-type stylus pen. In various embodiments, at least some of the sensor modules 304 and 519 and/or at least some of the key input devices 317 may be disposed in the first regions 310D and/or the second regions 310E.

According to an embodiment, the audio modules 303, 307, and 314 may include, for example a microphone hole 303 and speaker holes 307 and 314. The microphone hole 303 may include a microphone disposed therein to acquire external sound, and in various embodiments, a plurality of microphones may be disposed therein to be able to detect the direction of sound. The speaker holes 307 and 314 may include an external speaker hole 307 and a phone call receiver hole 314. In various embodiments, the speaker holes 307 and 314 and the microphone hole 303 may be implemented as a single hole, or a speaker may be included therein without the speaker holes 307 and 314 (e.g., a piezo speaker). The audio modules 303, 307, and 314 are not limited to the above-described structure, and may be variously changed in design depending on the structure of the electronic device 101, for example, by mounting only some of the audio modules or by adding new audio modules.

According to an embodiment, the sensor modules 304, 316, and 319 may generate an electrical signal or a data value corresponding to, for example, the internal operating condition or the external environmental condition of the electronic device 101. The sensor modules 304, 316, and 319 may include, for example, a first sensor module 304 (e.g., a proximity sensor) and/or a second sensor module (not illustrated) (e.g., a fingerprint sensor) disposed on the first surface 310A of the housing 310, and/or a third sensor module 319 (e.g., an HRM sensor) and/or a fourth sensor module 316 (e.g., a fingerprint sensor) disposed on the second surface 310B of the housing 310. The fingerprint sensor may be disposed not only on the first surface 310A of the housing 310 (e.g., the display 301), but also on the second surface 310B. The electronic device 101 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304. The sensor modules 304, 316, and 319 are not limited to the above-described structure, and may be variously changed in design depending on the structure of the electronic device 101, for example, by mounting only some of the sensor modules or by adding new sensor modules.

According to an embodiment, the camera modules 305, 312, and 313 may include, for example, a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, for example, a light-emitting diode or a xenon lamp. In various embodiments, two or more lenses (e.g., an infrared camera, a wide-angle lens, and a telephoto lens), and image sensors may be disposed on one surface of the electronic device 101. The camera modules 305, 312, and 313 are not limited to the above-described structure, and may be variously changed in design depending on the structure of the electronic device 101, for example, by mounting only some of the camera modules or by adding new camera modules.

According to an embodiment, the key input devices 317 may be disposed on the side surface 310C of the housing 310. In an embodiment, the electronic device 101 may not include all or part of the above-mentioned key input devices 317, and a key input device 317, which is not included in the electronic device 300, may be implemented in another form, such as a soft key, on the display 301. In various embodiments, the key input devices may include a sensor module 316 disposed on the second surface 310B of the housing 310.

According to an embodiment, the light-emitting element 306 may be disposed on, for example, the first surface 310A of the housing 310. The light-emitting elements 306 may provide, for example, information about the state of the electronic device 101 in an optical form. In an embodiment, the light-emitting elements 306 may provide a light source that is interlocked with, for example, the operation of the camera module 305. The light-emitting elements 306 may include, for example, an LED, an IR LED, and a xenon lamp.

According to an embodiment, the connector holes 308 and 309 may include, for example, a first connector hole 308 capable of accommodating a connector (e.g., a USB connector) for transmitting/receiving power and/or data to/from an external electronic device, and/or a second connector hole 309 capable of accommodating a connector (e.g., an earphone jack) for transmitting/receiving an audio signal to/from an external electronic device. The connector holes 308 and 309 are not limited to the above-described structure, and may be variously changed in design depending on the structure of the electronic device 101, for example, by providing only some of the connector holes or by adding new connector holes.

Figure 4:
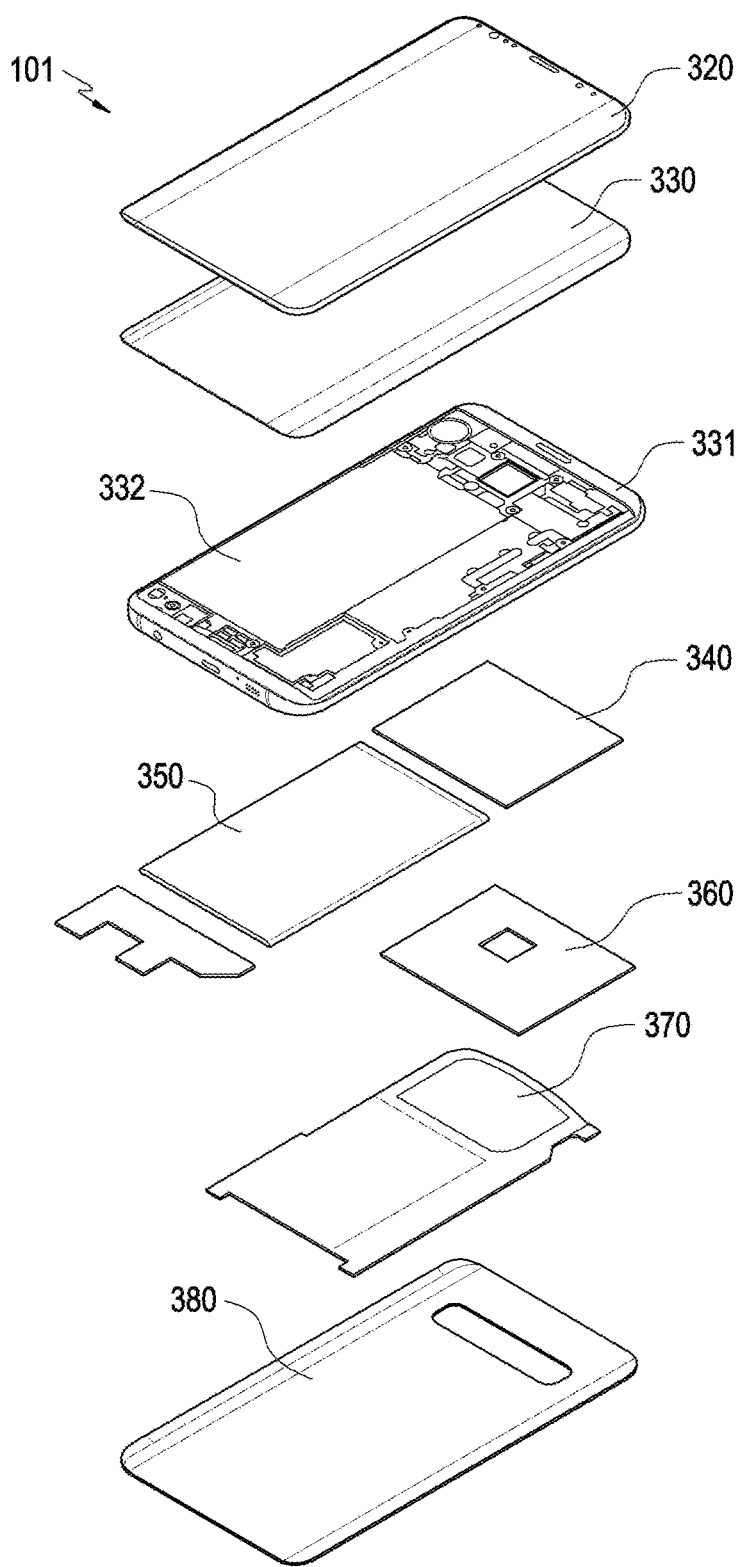
FIG. 4 is an exploded perspective view illustrating the electronic device according to various embodiments.

FIG. 4 is an exploded perspective view illustrating an electronic device 101 according to various embodiments.

Referring to FIG. 4, the electronic device 101 according to various embodiments (e.g., the electronic device 101 in FIGS. 1 to 3) may include a side bezel structure 331, a first support member 332 (e.g., a bracket), a front plate 320, a display 330, a printed circuit board 340, a battery 350, a second support member 360 (e.g., a rear case), an antenna 370, and a rear plate 380. In various embodiments, at least one of the components (e.g., the first support member 332 or the second support member 360) may be omitted from the electronic device 101, or other components may be additionally included in the electronic device 101. At least one of the components of the electronic device 101 may be the same as or similar to at least one of the components of the electronic device 101 of FIG. 2 or FIG. 3, and a redundant description thereof is omitted below.

According to various embodiments, the first support member 332 may be disposed inside the electronic device 101, and the first support member 332 may be connected to the side bezel structure 331, or may be integrated with the side bezel structure 331. The first support member 332 may be made of, for example, a metal material and/or a non-metal material (e.g., a polymer). The display 330 may be coupled to one surface of the first support member 332, and the printed circuit board 340 may be coupled to the other surface of the first support member 332. On the printed circuit board 340, a processor, a memory, and/or an interface may be mounted. The processor may include one or more of, for example, a central processing unit, an application processor, a graphics processor, an image signal processor, a sensor hub processor, or a communication processor.

According to various embodiments, the memory may include, for example, a volatile memory or a nonvolatile memory.

According to various embodiments, the interface may include, for example, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/an MMC connector, or an audio connector.

According to various embodiments, the battery 350 is a device for supplying power to at least one component of the electronic device 101 and may include, for example, a non-rechargeable primary battery, a rechargeable secondary battery, or a fuel cell. At least a part of the battery 350 may be disposed on substantially the same plane as, for example, the printed circuit board 340. The battery 350 may be integrally disposed inside the electronic device 101, or may be detachably disposed on the electronic device 101.

According to various embodiments, the antenna 370 may be disposed between the rear plate 380 and the battery 350. The antenna 370 may include, for example, a near-field communication (NFC) antenna, a wireless charging antenna, and/or a magnetic secure transmission (MST) antenna. The antenna 370 may perform short-range communication with, for example, an external device, or may transmit/receive power required for charging to/from the external device in a wireless manner. In an embodiment, an antenna structure may be implemented by a part of the side bezel structure 331, a part of the first support member 332, or a combination thereof.

Figure 5A:
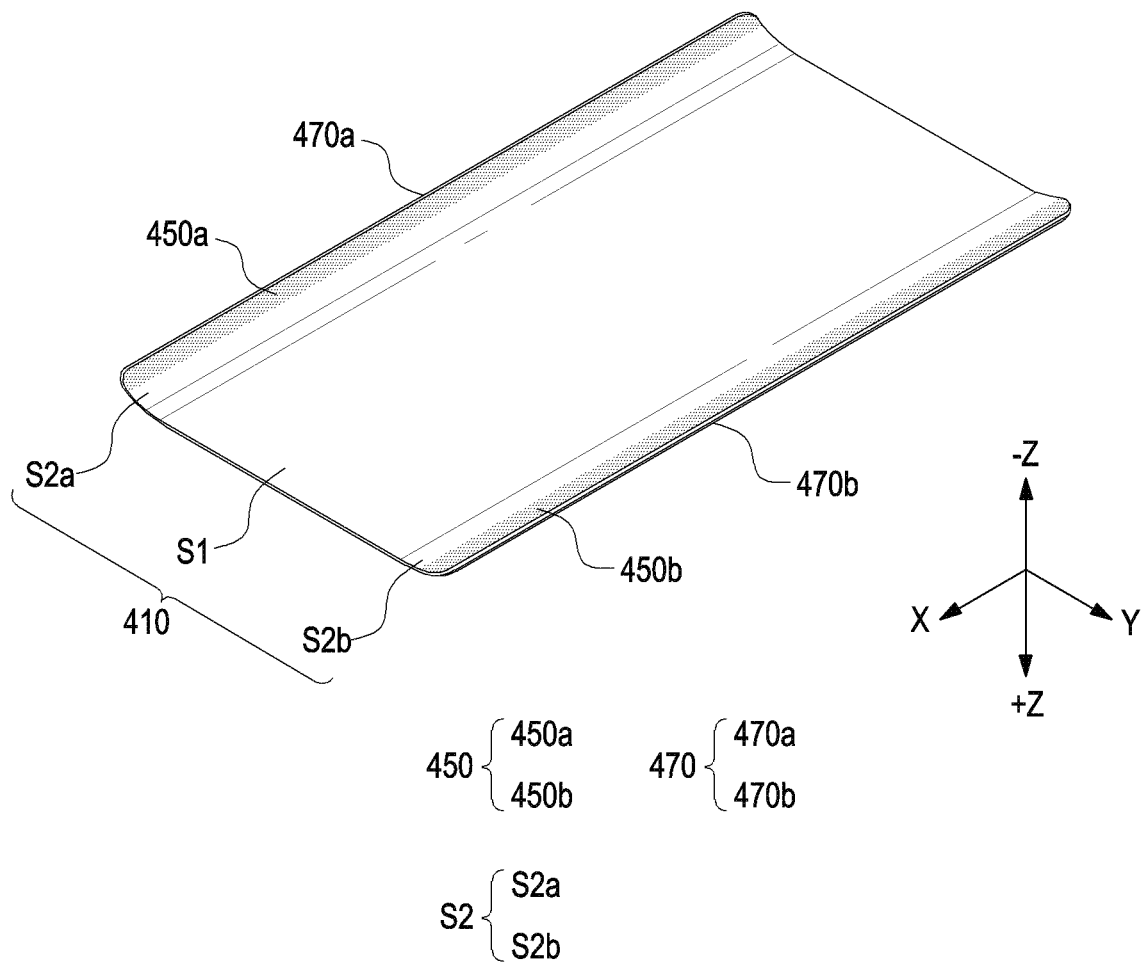
FIG. 5A is a perspective view illustrating a glass plate of an electronic device and a protective layer and a processed layer disposed on at least a part of the glass plate according to various embodiments.
Figure 5B:
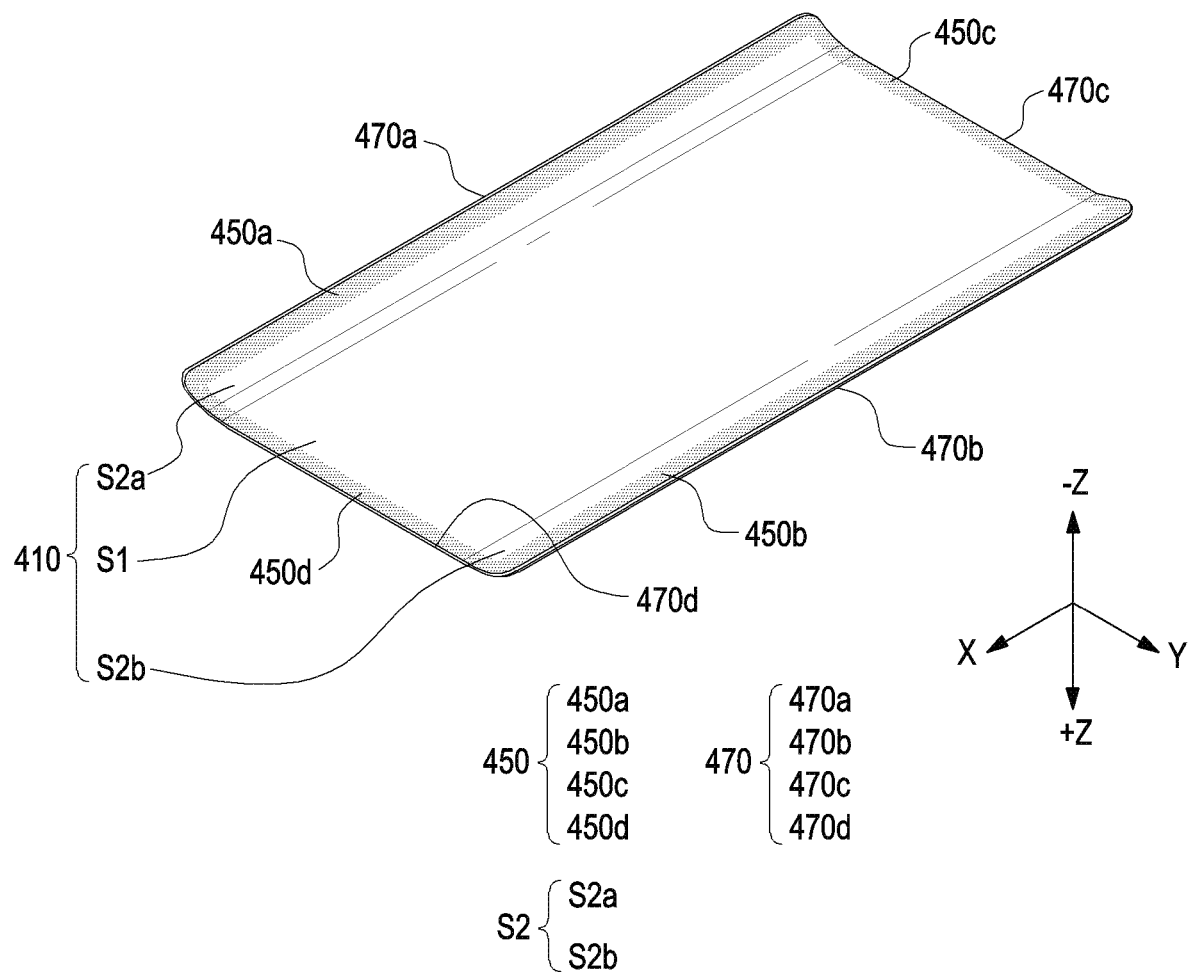
FIG. 5B is a perspective view illustrating a glass plate of an electronic device and a protective layer and a processed layer disposed on at least a part of the glass plate according various embodiments.

FIG. 5A is a perspective view illustrating a glass plate of an electronic device and a protective layer and a processed layer disposed on at least a part of the glass plate according to various embodiments. FIG. 5B is a perspective view illustrating a glass plate of an electronic device and a protective layer and a processed layer disposed on at least a part of the glass plate according to various embodiments.

In FIGS. 5A and 5B, "X" in the triaxial orthogonal coordinate system may refer, for example, to the longitudinal direction of the glass plate, "Y" may refer, for example, to the width direction of the glass plate, and "Z" may refer, for example, to the thickness direction of the glass plate. In addition, in an embodiment of the disclosure, "Z" may refer, for example, to the forward direction (+Z) and the rearward direction (-Z).

According to various embodiments, an electronic device (e.g., the electronic device 101 in FIGS. 1 to 4) may include a glass plate 410 (e.g., the first glass plate or the second glass plate), a protective layer 450, and a processed layer 470. According to an embodiment, the glass plate 410 of FIGS. 5A and 5B may be partially or wholly the same as the configuration of the front plate 320 of FIG. 4, and the glass plate 410 of FIGS. 5A and 5B may be partially or wholly the same as the configuration of the rear plate 380 of FIG. 4.

Referring to FIGS. 5A and 5B, the glass plate 410 of the electronic device 101 may cover the front or rear face of the electronic device 101, and at least a part thereof may be made of a transparent glass material. At least a part of the glass plate 410 may include a curved surface (e.g., 2.5D or 3D). For example, the glass plate 410 may include a flat portion S1 and curved portions S2 providing curved surfaces extending from the flat portion S1. The flat portion S1 may be a central region of the glass plate 410, and the curved portions S2 may be portions of end regions of the glass plate 410. The curved portions S2 have curved structures which are seamlessly bent in the rearward direction (-Z), and may be arranged in longitudinal edge (long edge) regions of the glass plate 410.

According to an embodiment, the curved portions S2 may be provided in the periphery region of the glass plate 410 with reference to the flat portion S1 as the center. For example, the curved portions S2 include a first curved portion S2a and a second curved portion S2b, and the first curved portion S2a and the second curved portion S2b may be located at opposite ends in the longitudinal direction (X) of the glass plate 410 and may not be located at opposite ends in the width direction (Y).

According to various embodiments, a protective layer 450 and a processed layer 470 may be disposed in at least a part of the curved portions S2 of the glass plate 410. The protective layer 450 and the processed layer 470 may be provided to surround at least a part of the side surface and/or the inner surface (e.g., in the rearward direction (-Z)) of each curved portion S2.

According to an embodiment, the protective layer 450 and the processed layer 470 may be disposed at the opposite ends of the glass plate 410 to provide a light leakage prevention and/or reduction function and an impact prevention and/or reduction function in the opposite end regions of the glass plate 410. Referring to FIG. 5A, the protective layer 450 may include a first protective layer 450a and a second protective layer 450b, and the first protective layer 450a may be coated on at least one surface of the first curved portion S2a. As another example, the second protective layer 450b may be coated on at least one surface of the second curved portion S2b. According to an embodiment, the first protective layer 450a and the second protective layer 450b may have the same or similar thickness and length to correspond to each other. As another example, the processed layer 470 may include a first processed layer 470a and a second processed layer 470b, and the first processed layer 470a may be provided on at least one surface of the first curved portion S2a to extend from an end of the first protective layer 450a or to partially overlap the first protective layer 450a. As another example, the second processed layer 470b may be provided on at least one surface of the second curved portion S2b to extend from an end of the second protective layer 450b or to partially overlap the second protective layer 450b. According to an embodiment, the first processed layer 470a and the second processed layer 470b may have the same or similar thickness and length to correspond to each other.

Referring to FIG. 5B, the protective layer 450 may include a first protective layer 450a, a second protective layer 450b, a third protective layer 450c, and a fourth protective layer 450d. The first protective layer 450a may be coated on at least one surface of the first curved portion S2a, and the second protective layer 450b may be coated on at least one surface of the second curved portion S2b. The third protective layer 450c and the fourth protective layer 450d may be coated respectively on the opposite end regions provided along the width direction (Y) of the glass plate 410. The first protective layer 450a, the second protective layer 450b, the third protective layer 450c, and the fourth protective layer 450d may be connected to each other. Therefore, all the regions of the periphery of the glass plate 410 may be coated with the protective layer 450.

The processed layer 470 may include a first processed layer 470a, a second processed layer 470b, a third processed layer 470c, and a fourth processed layer 470d. The first processed layer 470a may be provided on at least one surface of the first curved portion S2a to extend from an end of the first protective layer 450a or to partially overlap the first protective layer 450a. The second processed layer 470b may be provided on at least one surface of the second curved portion S2b to extend from an end of the second protective layer 450b or to partially overlap the second protective layer 450b. The third processed layer 470c and the fourth processed layer 470d may be provided on the opposite end regions located in the width direction (Y) of the glass plate 410 through a surface treatment. The third processed layer 470c may be provided to extend from an end of the third protective layer 450c or to partially overlap the third protective layer 450c. The fourth processed layer 470d may be provided to extend from an end of the fourth protective layer 450d or to partially overlap the fourth protective layer 450d. The first processed layer 470a, the second processed layer 470b, the third processed layer 470c, and the fourth processed layer 470d may be connected to each other. Therefore, the processed layer 470 may be provided over all of the regions of the periphery of the glass plate 410.

According to various embodiments, at least a part of each of the curved portions S2 of the glass plate 410, on which the protective layer 450 and the processed layer 470 are disposed, includes a curved shape and may be provided as a combination of a curved shape in one portion and a flat shape in another portion. As another example, it has been described that the protective layer 450 and the processed layer 470 are disposed on the curved portions S2 of the glass plate 410, as illustrated in FIGS. 5A and 5B. However, the disclosure is not limited thereto, and when an end portion of the glass plate is produced as a flat surface, the protective layer and the processed layer may be disposed on at least a part of the side surface and/or the inner surface of the end portion of the glass plate.

Figure 6:
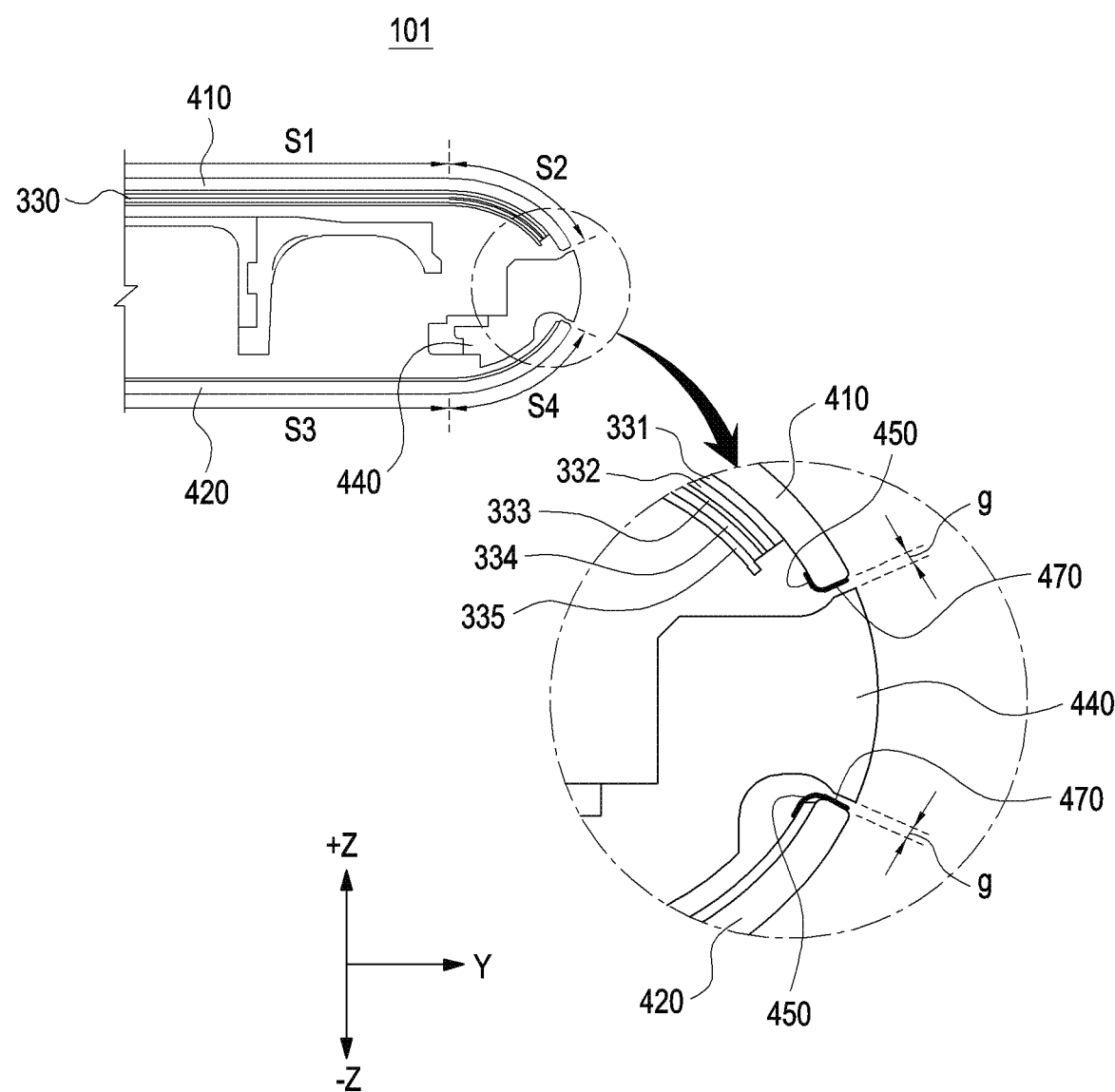
FIG. 6 is a cross-sectional view illustrating an arrangement relationship between coated regions of glass plates and a bracket of an electronic device according to various embodiments.

FIG. 6 is a cross-sectional view illustrating an arrangement relationship between coated regions of glass plates and a bracket of an electronic device according to various embodiments.

In FIG. 6, "Y" in a 2-axis orthogonal coordinate system may indicate the width direction of an electronic device, and "Z" may indicate the thickness direction of the electronic device.

According to various embodiments, the electronic device 101 may include a bracket (e.g., the first support member 332 in FIG. 4), a first glass plate 410, a second glass plate 420, a display 330, a protective layer 450, and a processed layer 470. The configurations of the bracket 440, the first glass plate 410, the second glass plate 420 and the display 330 of FIG. 6 may be the same in whole or in part as those of the support member 332, the front plate 320, the rear plate 380, and the display 330 of FIG. 4.

According to various embodiments, the bracket 440 configures a part of a housing (e.g., the housing 310 in FIGS. 2 and 3), and may support the electronic device 101 as a whole or may provide a space in which electronic components can be mounted.

According to various embodiments, the first glass plate 410 may be disposed in the forward direction (the +Z direction) of the bracket 440, and the second glass plate 420 may be disposed in the rearward direction of the bracket 440 (the −Z direction). The first glass plate 410 may be attached or coupled to the housing 310 (refer to FIGS. 2 and 3) so as to define an internal space together with the housing (e.g., the bracket 440), and may include a peripheral portion adjacent to the bracket 440. The peripheral portion of the first glass plate 410 may include opposite ends of long edges of the first glass plate 410. In an embodiment, opposite ends of the first glass plate 410 and the second glass plate 420 may include curved surfaces. For example, the first glass plate 410 may include a flat portion S1 and a curved portion S2 extending from an edge of the flat portion S1. The second glass plate 420 may include a flat portion S3 and a curved portion S4 extending from an edge of the flat portion S3.

According to various embodiments, the curved portion S2 of the first glass plate 410 may be provided at the opposite ends located along the longitudinal direction of the first glass plate 410, and may seamlessly extend from the flat portion S1 by being bent toward the second glass plate 420. As another example, the curved portion S4 of the second glass plate 420 may be provided at the opposite ends located along the longitudinal direction of the second glass plate 420, and may seamlessly extend from the flat portion S3 by being bent toward the first glass plate 410. The first glass plate 410 and the second glass plate 420 may be disposed to face at least a part of the bracket 440 due to the curved portions S2 and S4.

According to various embodiments, a protective layer 450 and/or a processed layer 470 may be disposed on at least a part of the curved portion S2 of the first glass plate 410 and/or the curved portion S4 of the second glass plate 420. For example, the protective layer 450 coated on the first glass plate 410 may be disposed to enclose at least a part of the inner surface and/or the side surface of the first glass plate 410. As another example, the processed layer 470 provided on the first glass plate 410 may be disposed to enclose at least a part of the inner surface and/or the side surface of the first glass plate 410.

According to an embodiment, at least a part of the protective layer 450 may be disposed between the outer surface of the first glass plate 410 and the bracket 440 to mitigate the impact applied to the bracket 440 from the first glass plate 410. As another example, at least a part of the protective layer 450 may be disposed between the outer surface of the second glass plate 420 and the bracket 440 to mitigate the impact applied to the bracket 440 from the second glass plate 420. A partial region of the curved portion S2 of the first glass plate 410 and/or a partial region of the curved portion S4 of the second glass plate 420 may be disposed adjacent to the bracket 440 made of a metal material, and a gap g may exist between the ends of each of the glass plates (the first glass plate 410 and/or the second glass plate 420) and the bracket 440. When an external impact is applied, the gap g may be reduced so that the bracket 440 made of a metal having a great material strength may directly collide with the curved portion S2 or S4 of the plates (the first glass plate 410 and/or the second glass plate 420) made of a glass having a small material strength and thus an impact may be applied to the curved portion S2 or S4. Accordingly, a partial region of the curved portion S2 or S4 of the glass plates (the first glass plate 410 and/or the second glass plate 420) may be damaged. The protective layer 450 provided on the curved portion S2 or S4 of the glass plates (the first glass plate 410 and/or the second glass plate 420) according to the disclosure may provide a buffer region in the gap g and may protect the side surface of the glass plate, thereby preventing and/or reducing damage due to the impact applied by the bracket 440.

According to an embodiment, at least a part of the processed layer 470 may be provided on the outer surface of the first glass plate 410 to suppress the light leakage phenomenon of light reflected through the inside of the first glass plate 410. As another example, at least a part of the processed layer 470 may be provided on the outer surface of the second glass plate 420 to suppress the light leakage phenomenon of light reflected through the inside of the second glass plate 420. Since a partial region of the curved portion S2 of the first glass plate 410 and/or a partial region of the curved portion S4 of the second glass plate 420 has an inwardly curved structure, the light emitted from the display travels inside the glass plate while being substantially totally reflected and reaches opposite ends of the glass plate exposed to the outside. Thus, a light leakage phenomenon may occur. According to the disclosure, the processed layer 470 provided on the curved portion S2 or S4 of the glass plates (the first glass plate 410 and/or the second glass plate 420) may be provided through a surface treatment of the side surface of the glass plate to suppress the light leakage phenomenon of light emitted from the display.

According to various embodiments, the display 330 may be disposed on one surface of the first glass plate 410. The display 330 may have a plurality of layers 331, 332, 333, 334 and 335 laminated in the inward direction of the electronic device. For example, a UV layer 331, a display panel 332, a light-shielding layer 333, a support layer 334, and a metal layer 335 are laminated in this order with reference to one surface of the first glass plate 410. However, in addition to the lamination order limited to this, the lamination order may be changed in design to an efficient lamination order depending on buffering, shielding, and/or heat dissipation.

According to an embodiment, the UV layer 331 of the display 330 may be bonded to one surface of the first glass plate 410, and may be manufactured in a curved shape to face the curved portion S2 of the first glass plate 410. According to an embodiment, the light-shielding layer 333 may be provided as a layer that shields the rear surface of the display panel 332. The light-shielding layer 333 may be, for example, a cushion member, an embossing member, or a copper (Cu) sheet, and may include black color. As another example, the support layer 334 may support the display 330, and the metal layer 335 may provide a heat dissipation function to block heat from a board or to prevent and/or reduce the heat from being transferred to the display panel 332. For example, the metal layer 335 may include a graphite material.

Figure 7:
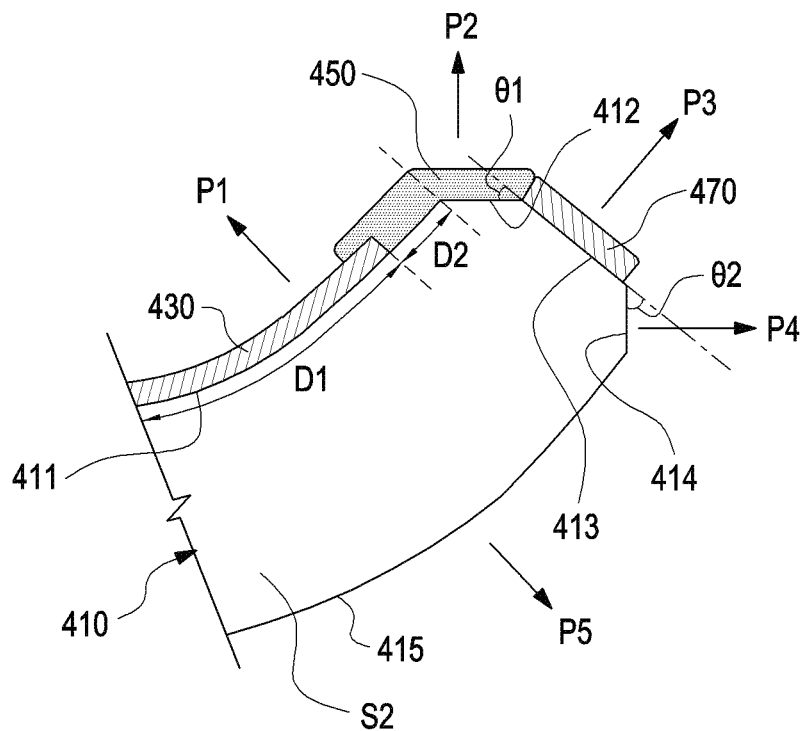
FIG. 7 is a cross-sectional view illustrating an arrangement relationship of an opaque layer, a protective layer, and a processed layer disposed on a partial region of a glass plate of an electronic device according to various embodiments.

FIG. 7 is a cross-sectional view illustrating an arrangement relationship of an opaque layer, a protective layer, and a processed layer disposed on a partial region of a glass plate of an electronic device according to various embodiments.

Referring to FIG. 7, an electronic device (e.g., the electronic device 101 in FIGS. 1 to 4) may include a housing (e.g., the housing 310 in FIGS. 2 and 3), a first glass plate 410, an opaque layer 430, a protective layer 450, and a processed layer 470. The first glass plate 410 of FIG. 7 may be the front plate (e.g., the front plate 320 in FIG. 4) or the rear plate (e.g., the rear plate 380 in FIG. 4) of the electronic device 101.

According to various embodiments, the first glass plate 410 may include a flat portion (e.g., the flat portion S1 in FIG. 5A) and a curved portion S2 extending from an edge of the flat portion S1. The opaque layer 430, the protective layer 450, and the processed layer 470 may be disposed on a part of the curved portion S2 of the first glass plate 410.

According to various embodiments, the curved portion S2 of the first glass plate 410 may include a first surface 411 oriented in a first direction P1, a second surface 412 extending from the first surface 411 and oriented in a second direction P2, a third surface 413 extending from the second surface 412 and oriented in a third direction P3, a fourth surface 414 extending from the third surface 413 and oriented in a fourth direction P4, and a fifth surface 415 extending from the fourth surface 414 and oriented in a fifth direction P5.

According to various embodiments, the first surface 411 and/or the second surface 412 may be disposed to face the inside of the electronic device 101, for example, to face the internal space defined by the housing 310. According to an embodiment, the third surface 413 may be disposed adjacent to the periphery of the housing 310. According to an embodiment, the fourth surface 414 and/or the fifth surface 415 may be disposed to face the outside of the electronic device 101, for example, to face away from the internal space defined by the housing 310. As another example, the first surface 411 and the fifth surface 415 may be disposed substantially parallel to each other.

According to various embodiments, the first surface 411, the second surface 412, the third surface 413, the fourth surface 414, and the fifth surface 415 may be oriented in different directions, respectively, and the first surface 411 and/or the fifth surface 415 may be provided as curved surfaces (e.g., 2.5D or 3D) oriented in different directions depending on the positions thereof.

According to an embodiment, the second surface 412 and the fourth surface 414 may be provided as flat surfaces, and may include surfaces having different inclinations relative to the third surface 413. For example, the second surface 412 may have a predetermined first inclination angle $\theta 1$ relative to the third surface 413, and the fourth surface 414 may have a predetermined second inclination angle $\theta 2$ relative to the third surface 413. The second surface 412 and the fourth surface 414 may extend from the opposite ends of the third surface 413, respectively, and may be oriented in different directions. As another example, the predetermined first inclination angle $\theta 1$ may be in a range of about 30 to 70 degrees from the extension line of one end of the third surface 413, and the predetermined angle of the fourth surface 414 may be in a range of about 30 to 70 degrees from the extension line of the other end of the third surface 413.

According to various embodiments, the opaque layer 430 may be disposed on one surface of the first glass plate 410. According to an embodiment, the opaque layer 430 may be a printed layer when the first glass plate 410 is the front plate. For example, the printed layer may be manufactured by directly coating a polyester-based polymer resin or opaque ink (e.g., acrylic ink) on the rear surface region of the first glass plate 410. According to an embodiment, the opaque layer 430 may be a film layer when the first glass plate 410 is the rear plate. For example, the film layer may be laminated to the first glass plate 410 via an adhesive material (e.g., OCA). The film layer may include a structure in which a UV molded layer (pattern formation), a vapor deposition layer, and a printed layer are sequentially laminated toward the rear surface based on a transparent film (e.g., PET) and may be opaque as a whole by the printed layer.

According to various embodiments, the opaque layer 430 may be disposed from one side of the flat portion S1 of the first glass plate 410 to the first surface 411 of the curved portion S2. The opaque layer 430 disposed on the first surface 411 of the curved portion S2 may be disposed to be spaced apart from the end of the second surface 412 having the first inclination angle $\theta 1$. For example, the opaque layer 430 may be provided on a first region D1 of the first surface 411 and may disposed so as not to cover a second region D2 between the second surface 412 and the first region D1. According to an embodiment, the opaque layer 430 may include a first material that is different from a second material of the protective layer 450, and the first material may include acrylic ink.

According to various embodiments, the protective layer 450 may be disposed on one surface of the first glass plate 410. The protective layer 450 may be disposed to enclose at least a partial region of the first surface 411, the second surface 412, or the third surface 413 of the curved portion S2. According to an embodiment, the protective layer 450 may be disposed to enclose at least a part of the opaque layer 430. For example, the protective layer 450 may be provided to cover the second region D2 of the first surface 411 and a part of the opaque layer 430. At least a part of the protective layer 450 may be disposed to face the first region D1 of the first surface 411 with the opaque layer 430 interposed therebetween.

According to an embodiment, a partial region (e.g., the first region D1) of the protective layer 450 coated on the first surface 411 may cover a part of the opaque layer 430 (e.g., a printed layer). The end region of the opaque layer 430 and the end region of the protective layer 450 may overlap each other when viewing the first glass plate 410. Thanks to the overlap region, it is possible to prevent and/or reduce the opaque layer 430 from being damaged. For example, the printed layer provided on one surface of the first glass plate 410, which is provided as a curved surface, may be difficult to print, and the end portion thereof may easily be torn off in a step subsequent to a print layer formation step. The protective layer 450 provided on the first surface 411 covers the terminal end of the opaque layer 430 and encloses the opaque layer 430 together with the first glass plate 410.

Thus, it is possible to prevent and/or reduce the torn-off phenomenon of the opaque layer 430.

According to various embodiments, the protective layer 450 may be coated on the entire region of the second surface 412 from the end region of the first surface 411 of the curved portion S2 and may be smoothly connected. The thickness of the protective layer 450 may be greater than 0 μm and less than or equal to about 100 μm. As another example, the thickness of the protective layer 450 may be about 10 μm to 50 μm. The protective layer 450 coated on the second surface 412 may be a region substantially facing a bracket (e.g., the end of the bracket 440 in FIG. 6) with a gap interposed therebetween, and may be a section in which the protective layer 450 collides with the bracket 440 by an external impact. The protective layer 450 coated on the second surface 412 may prevent and/or reduce the first glass plate 410 from being damaged by an external impact.

According to various embodiments, when the opaque layer 430 is provided as the printed layer, the protective layer 450 may be made of an opaque material to cover the opaque layer 430. For example, the protective layer 450 may be made of a carbon-containing material. According to an embodiment, when the opaque layer 430 is provided as a film layer, the protective layer 450 may be made of a transparent or opaque material. As another example, the protective layer 450 may be coated in at least a partial region of the first glass plate 410 using a coating liquid including at least one of acrylic melamine, modified acrylic, and modified epoxy. The protective layer 450 may be a coating liquid of various colors other than a transparent color. According to an embodiment, an operator may intentionally coat a partial region of the protective layer 450 with a large amount of coating liquid. For example, the protective layer 450 may be coated through intentional overflow over each of the above surfaces, through which the surface of the glass plate can be protected from an external impact. As another example, the protective layer 450 may provide aesthetics in design through intentional overflow over each of the surfaces and through various colored coating processes.

According to various embodiments, a processed layer 470 may be disposed on one surface of the first glass plate 410. The processed layer 470 may be provided in at least a partial region of the second surface 412, the third surface 413, or the fourth surface 414 of the curved portion S2. According to an embodiment, the processed layer 470 may be disposed to be in contact with or to be partially spaced apart from an end of the protective layer 450. As another example, when the protective layer 450 is disposed up to the second surface 412 or the third surface 413, the processed layer 470 may be provided such that at least a partial region thereof overlaps the protective layer 450.

According to various embodiments, the processed layer 470 may be provided through a surface treatment method. For example, the processed layer 470 may be processed through the surface treatment of one surface of the first glass plate 410 by a laser etching method or a sand blasting method.

According to an embodiment, the processed layer 470 may be a surface (the outer surface and/or inner surface) of the first glass plate 410 that has been processed through, for example, a laser etching or sand blasting method. The laser etching method is a method of processing the surface roughness of the first glass plate 410 using a laser and may provide a precise position control and various types of processes. The sand blasting method is a method of processing the surface roughness of the first glass plate 410 by spraying various abrasives (e.g., fine sand, ceramic, and the like), and various types of processes can be made by controlling the size and type of the abrasive.

According to an embodiment, the processed layer 470 may be provided with a uniform processing texture by performing a surface treatment on one surface of the first glass plate 410 through laser etching. The uniform processing texture may refer, for example, to the positional deviation of the thickness of the processed layer (or the processed surface) 470 being within about 2 μm and a spot size on one surface is within approximately 6 μm (see FIG. 13).

Referring to FIG. 7, the processed layer 470 may provide a light scattering surface over the entire region of the third surface 413 of the first glass plate 410, and as a result, it is possible to prevent and/or reduce a light leakage phenomenon directed to the third surface 413. According to an embodiment, the processed layer 470 can be easily provided even in a region where the inclination of the curved portion is sharply increased. For example, in the process of providing the protective layer 450 in the region in which the slope of the curved portion is steep, ink may flow down or overflow may occur. In the processed layer 470 of the disclosure, a uniform surface may be provided regardless of the inclination degree of the curved portion, thereby minimizing and/or reducing the region of the protective layer 450 (e.g., a printed coating region). As a result, a polishing process that has been essentially performed after coating by printing may be eliminated so that time and costs can be reduced.

According to an embodiment, the processed layer 470 may prevent and/or reduce glass damage by a laser etching or sand blasting method. During glass processing, an edge region (e.g., the third surface 413) and a chamfer region (e.g., the fourth surface 414 and the second surface 412) may be vulnerable to an external impact due to microcracks occurring on the surface of the processed surface. That is, abrasion may occur due to brittle damage, which may result in damage of the first glass plate 410. In order to prevent and/or reduce this, when the processed layer 470 is provided in some regions of the second surface 412, the third surface 413, and the fourth surface 414 of the first glass plate 410, it is possible to prevent and/or reduce damage by an external impact.

Figure 8:
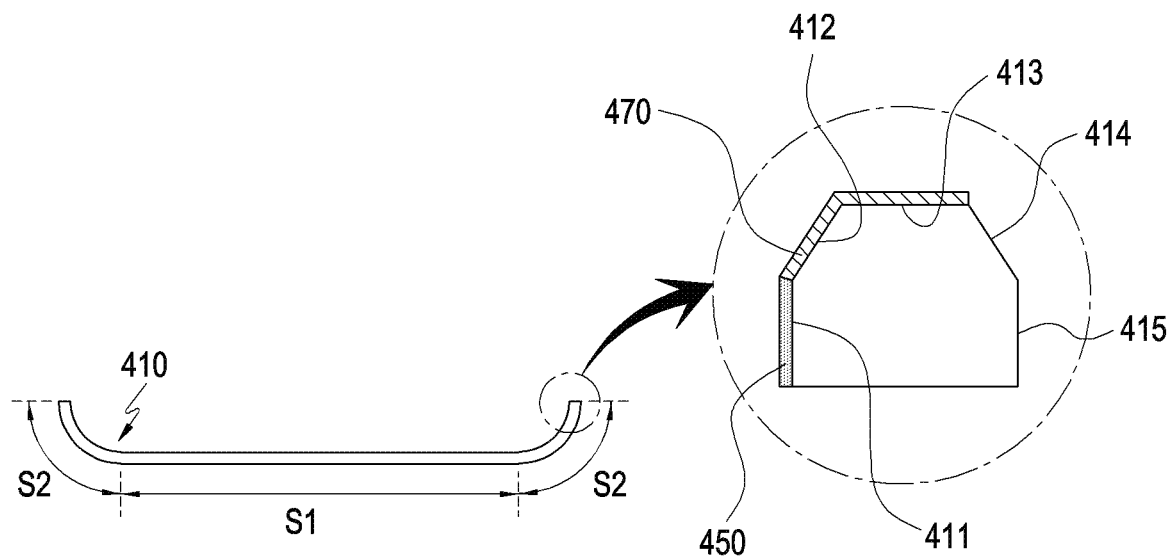
FIG. 8 is a cross-sectional view illustrating a partial region of a glass plate on which a protective layer and a processed layer are disposed, according to various embodiments.

FIG. 8 is a cross-sectional view illustrating a partial region of a glass plate on which a protective layer and a processed layer are disposed, according to various embodiments.

According to various embodiments, an electronic device (e.g., the electronic device 101 in FIGS. 1 to 4) may include a housing (e.g., the housing 310 in FIGS. 2 and 3), a first glass plate 410, a protective layer 450, and a processed layer 470. Referring to FIG. 8, the first glass plate 410 may be the front plate (e.g., the front plate 320 in FIG. 4) or the rear plate (e.g., the rear plate 380 in FIG. 4) of the electronic device 101.

According to various embodiments, the first glass plate 410 may include a flat portion (e.g., the flat portion S1 in FIG. 5A) and a curved portion S2 extending from an edge of the flat portion S1. The protective layer 450 and the processed layer 470 may be disposed on a part of the curved portion S2 of the first glass plate 410.

Hereinafter, the arrangement structure of the protective layer 450 and the processed layer 470 that are different from those of FIG. 7 will be mainly described. The configuration of FIG. 7 is applicable to the method of the protective layer 450 and the processed layer 470.

According to various embodiments, the protective layer 450 may be disposed on one surface of the first glass plate 410. The protective layer 450 may be disposed to enclose at least a partial region of the first surface 411 of the curved portion S2. The protective layer 450 may be made of an opaque material as a printed coating layer, and may protect a periphery region of the first glass plate 410 from an external impact.

According to various embodiments, the processed layer 470 may be disposed on one surface of the first glass plate 410. The processed layer 470 may be provided in the regions of the second surface 412 and the third surface 413 of the curved portion S2 through laser etching (or sand blasting). The second surface 412 and/or the third surface 413 may be a region in which a light leakage phenomenon may typically substantially occur. When the second surface 412 and/or the third surface 413 is improved in terms of roughness and is provided with a processed surface including a processing texture, it is possible to suppress a light leakage phenomenon.

In the method of providing the processed layer 470, after an entire glass fabric, from which a plurality of glass plates may be made, is subjected to a surface treatment, each of the glass plates may be provided through cutting, thermoforming, and polishing processes. As another method, after providing each of the glass plates by cutting the glass fabric and performing thermoforming and polishing processes, the glass plates may be subjected to a surface treatment.

Figure 9:
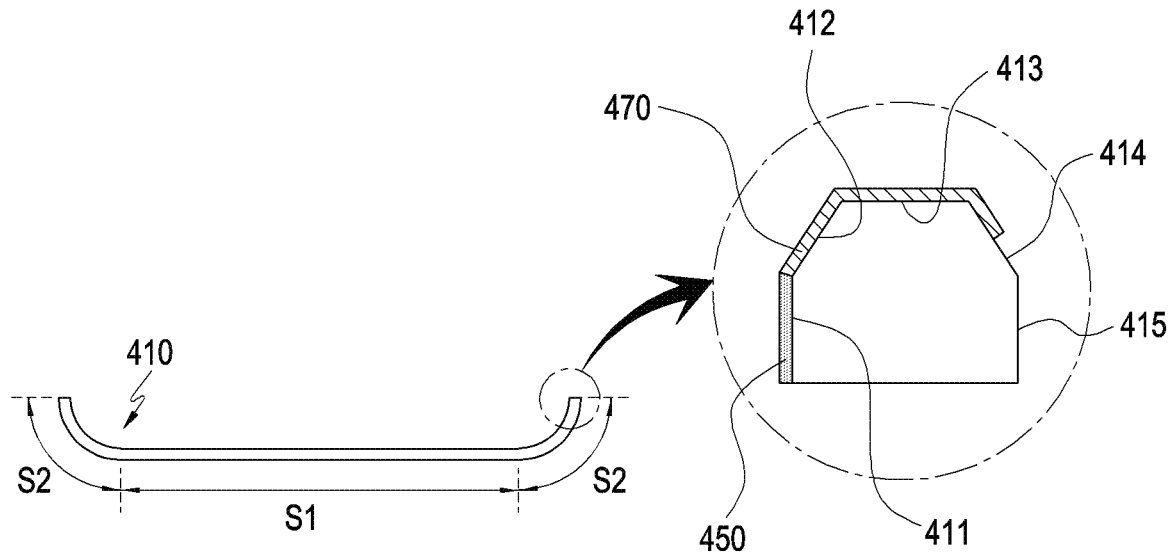
FIG. 9 is a cross-sectional view illustrating a partial region of a glass plate on which a protective layer and a processed layer are disposed, according to various embodiments.

FIG. 9 is a cross-sectional view illustrating a partial region of a glass plate on which a protective layer and a processed layer are disposed, according to various embodiments.

According to various embodiments, an electronic device (e.g., the electronic device 101 in FIGS. 1 to 4) may include a housing (e.g., the housing 310 in FIGS. 2 and 3), a first glass plate 410, a protective layer 450, and a processed layer 470. Referring to FIG. 9, the first glass plate 410 may include a flat portion S1 and a curved portion S2 extending from an edge of the flat portion S1. The protective layer 450 and the processed layer 470 may be disposed on a part of the curved portion S2 of the first glass plate 410.

Hereinafter, the arrangement structure of the protective layer 450 and the processed layer 470 that are different from those of FIGS. 7 and 8 will be mainly described. The configuration of FIG. 7 is applicable to the method of the protective layer 450 and the processed layer 470.

According to various embodiments, the protective layer 450 may be disposed on one surface of the first glass plate 410. The protective layer 450 may be disposed to enclose at least a partial region of the first surface 411 of the curved portion S2. The protective layer 450 may be disposed on the first surface 411 up to a region to be in contact with the second surface 412. The protective layer 450 may be made of an opaque material as a printed coating layer, and may protect a periphery region of the first glass plate 410 from an external impact.

According to various embodiments, the processed layer 470 may be disposed on one surface of the first glass plate 410. The processed layer 470 may be provided in some regions of the second surface 412, the third surface 413, and the fourth surface 414 of the curved portion S2 through laser etching (or sand blasting). The second surface 412 and the third surface 413 may be a region in which a light leakage phenomenon substantially occurs. When the second surface 412 and/or the third surface 413 is improved in terms of roughness and is provided with a surface including a processing texture, it is possible to suppress a light leakage phenomenon. A partial region of the fourth surface 414 is substantially invisible when the electronic device 101 is viewed from the outside, and the processed layer 470 may extend to the partial region of the fourth surface 414.

Figure 10:
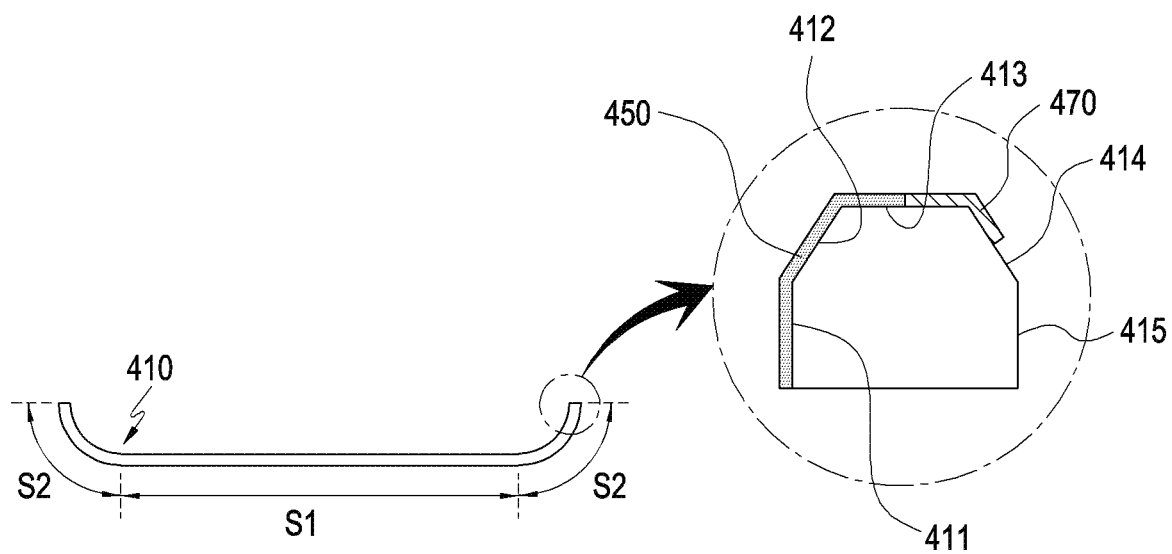
FIG. 10 is a cross-sectional view illustrating a partial region of a glass plate on which a protective layer and a processed layer are disposed, according to various embodiments.

FIG. 10 is a cross-sectional view illustrating a partial region of a glass plate on which a protective layer and a processed layer are disposed, according to various embodiments.

According to various embodiments, an electronic device (e.g., the electronic device 101 in FIGS. 1 to 4) may include a housing (e.g., the housing 310 in FIGS. 2 and 3), a first glass plate 410, a protective layer 450, and a processed layer 470. Referring to FIG. 10, the first glass plate 410 may include a flat portion S1 and a curved portion S2 extending from an edge of the flat portion S1. The protective layer 450 and the processed layer 470 may be disposed on a part of the curved portion S2 of the first glass plate 410.

Hereinafter, the arrangement structure of the protective layer 450 and the processed layer 470 that are different from those of FIGS. 7 to 9 will be mainly described. The configuration of FIG. 7 is applicable to the method of the protective layer 450 and the processed layer 470.

According to various embodiments, the protective layer 450 may be disposed on one surface of the first glass plate 410. The protective layer 450 may be disposed to enclose at least a partial region of the first surface 411, the second surface 412, and the third surface 413 of the curved portion S2. The protective layer 450 may be made of an opaque material as a printed coating layer, and may protect a periphery region of the first glass plate 410 from an external impact.

According to various embodiments, the processed layer 470 may be disposed on one surface of the first glass plate 410. The processed layer 470 may be provided in a partial region of the third surface 413 of the curved portion S2 through laser etching (or sand blasting). The third surface 413 on which the processed layer 470 is provided may be a region that does not overlap the protective layer 450, and the processed layer 470 may extend from the third surface 413 to be expanded to a partial region of the fourth surface 414. The second surface 412 and/or the third surface 413 may be a region in which a light leakage phenomenon typically substantially occurs. When the second surface 412 and/or the third surface 413 is improved in terms of roughness and is provided with a surface including a processing texture, it is possible to suppress a light leakage phenomenon. A partial region of the fourth surface 414 may be a region that is not visually recognized when the electronic device 101 is viewed from the outside.

Figure 11:
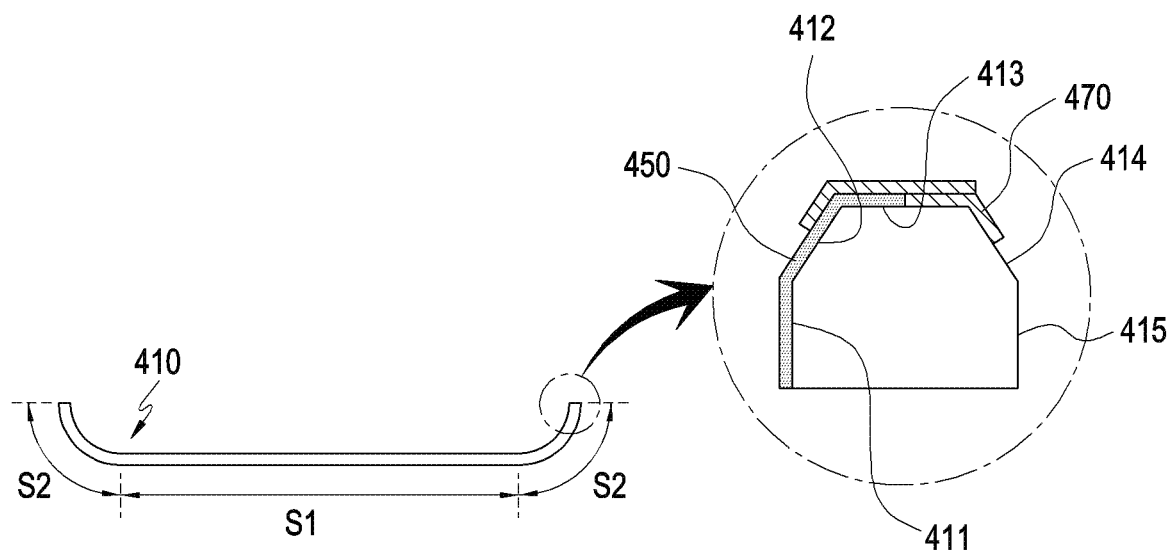
FIG. 11 is a cross-sectional view illustrating a partial region of a glass plate on which a protective layer and a processed layer are disposed, according to various embodiments.

FIG. 11 is a cross-sectional view illustrating a partial region of a glass plate on which a protective layer and a processed layer are disposed, according to various embodiments.

According to various embodiments, an electronic device (e.g., the electronic device 101 in FIGS. 1 to 4) may include a housing (e.g., the housing 310 in FIGS. 2 and 3), a first glass plate 410, a protective layer 450, and a processed layer 470. Referring to FIG. 11, the first glass plate 410 may include a flat portion S1 and a curved portion S2 extending from an edge of the flat portion S1. The protective layer 450 and the processed layer 470 may be disposed on a part of the curved portion S2 of the first glass plate 410.

Hereinafter, the arrangement structure of the protective layer 450 and the processed layer 470 that are different from those of FIGS. 7 to 10 will be mainly described. The configuration of FIG. 7 is applicable to the method of the protective layer 450 and the processed layer 470.

According to various embodiments, the protective layer 450 may be disposed on one surface of the first glass plate 410. The protective layer 450 may be disposed to enclose at least a partial region of the first surface 411, the second surface 412, and the third surface 413 of the curved portion S2. The protective layer 450 may be made of an opaque material as a printed coating layer, and may protect a periphery region of the first glass plate 410 from an external impact.

According to various embodiments, the processed layer 470 may be disposed on one surface of the first glass plate 410. The processed layer 470 may be provided in some regions of the second surface 412, the third surface 413, and the fourth surface 414 of the curved portion S2 through laser etching (or sand blasting). The second surface 412 and/or the third surface 413 may be a region in which a light leakage phenomenon typically substantially occurs. When the second surface 412 and/or the third surface 413 is improved in terms of roughness and is provided with a surface including a processing texture, it is possible to suppress a light leakage phenomenon.

According to an embodiment, the protective layer 450 may extend from the first surface 411 and may be disposed up to a region of the third surface 413, and the processed layer 470 may be provided to overlap a partial region of the second surface 412 and the third surface 413 of the protective layer 450 and may extend to the remaining region of the third surface 413 and a partial region of the fourth surface 414. According to an embodiment, when the processed layer 470 is provided after the protective layer 450 is coated, the protective layer 450 disposed on the second surface 412 and the third surface 413 may be subjected to a surface treatment through laser etching (or sand blasting) to be provided in a reduced thickness. According to an embodiment, when the processed layer 470 is provided after the protective layer 450 is coated, the protective layer 450 disposed on the second surface 412 and the third surface 413 is mostly removed through laser etching (or sand blasting), and the processed layer 470 may be provided by performing a surface treatment directly on one surface of the glass plate.

Figure 12A:
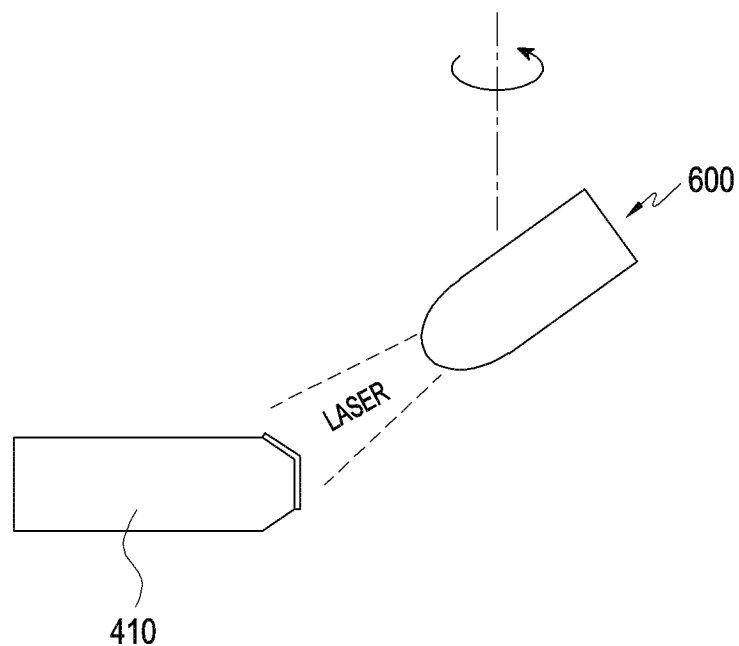
FIGS. 12A and 12B are diagrams illustrating an example method of performing laser etching on one surface of a glass plate according to various embodiments.
Figure 12B:
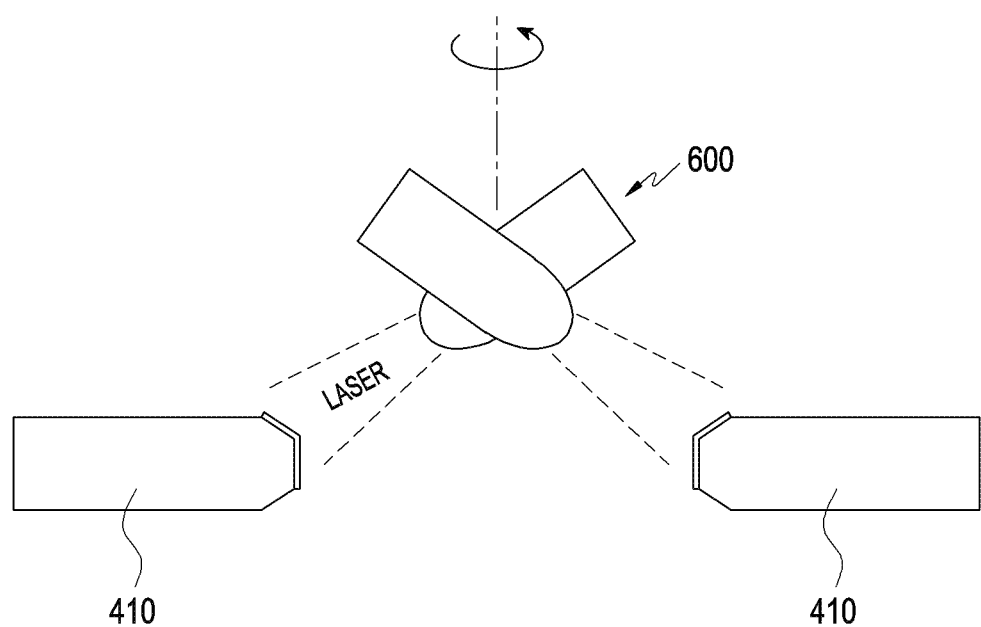

FIGS. 12A and 12B are diagrams illustrating an example method of performing laser etching on one surface of a glass plate according to various embodiments.

The first glass plate 410 of FIGS. 12A and 12B may be the front plate (e.g., the front plate 320 in FIG. 4) or the rear plate (e.g., the rear plate 380 in FIG. 4) of the electronic device 101.

Referring to FIG. 12A, it is illustrated that an etching method is performed using a laser 600 in a region that requires a surface treatment along a region outside the first glass plate 410.

Referring to FIG. 12B, it is illustrated that an etching method is performed using a laser 600 in a region that requires a surface treatment along a region inside the first glass plate 410. Since a camera or a connector is mounted, recesses and/or holes having various irregular shapes to be exposed to the outside may be disposed in a partial region of the first glass plate 410. A partial region of the first glass plate 410 that defines the peripheries of these recesses and/or holes may also be subjected to laser etching to alleviate a light leakage phenomenon or an impact applied from the outside. For example, the laser 600 rotates about the central axes of the recesses and/or holes to perform a surface treatment on the inner surface of the first glass plate 410 defining the peripheries of the recesses and/or holes.

Figure 13:
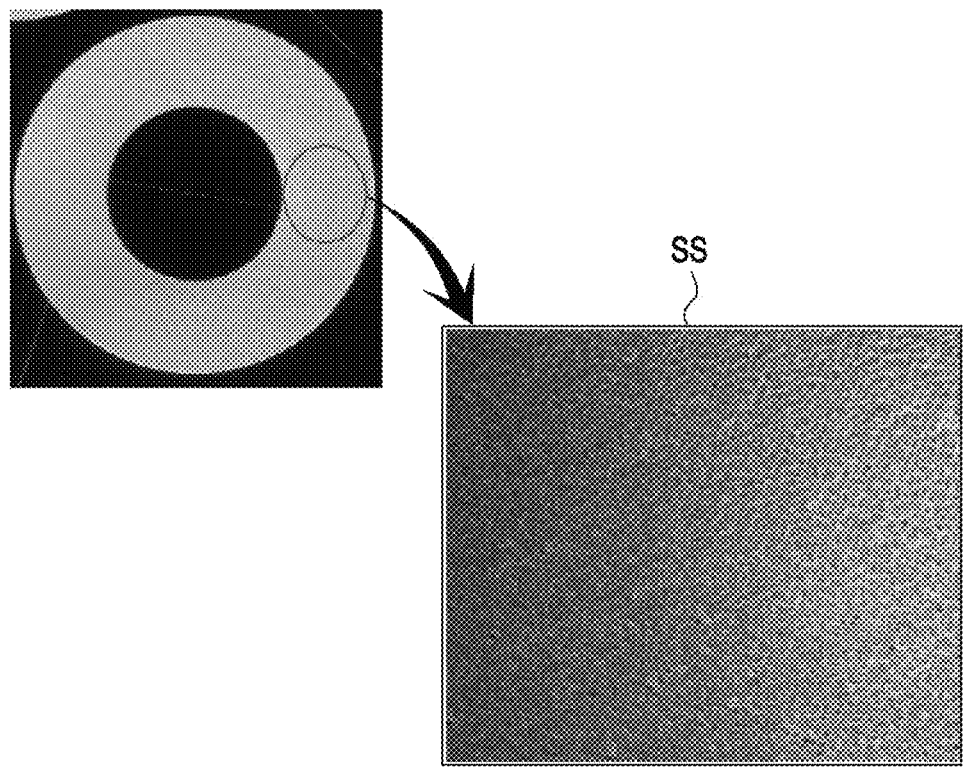
FIG. 13 and FIGS. 14A and 14B are views illustrating one surface of a glass plate subjected to a surface treatment through laser etching, according to various embodiments.
Figures 14A, 14B:
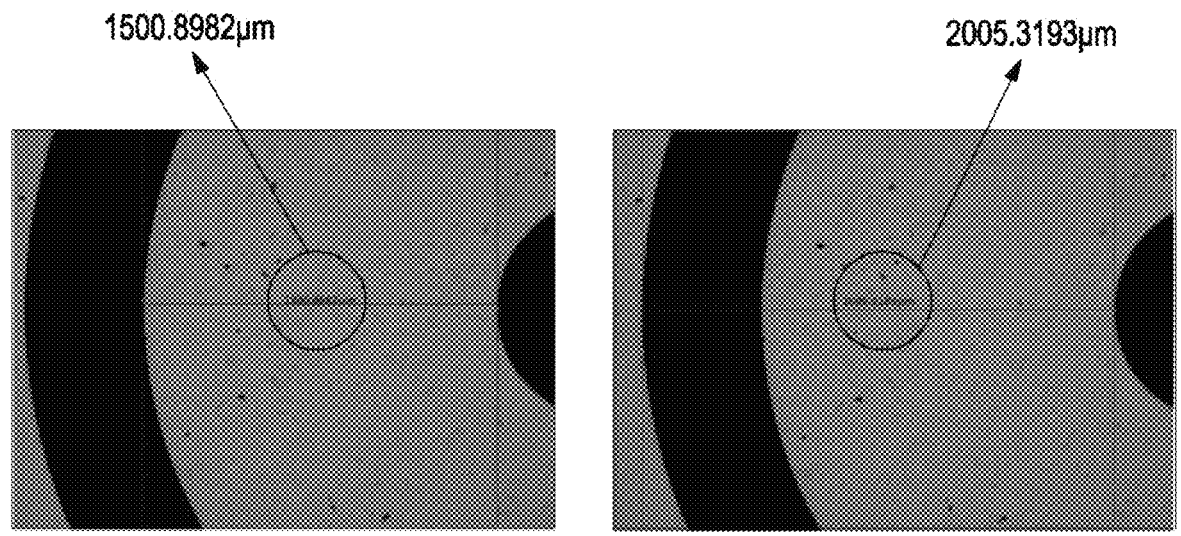

FIG. 13 and FIGS. 14A and 14B are views illustrating one surface of a glass plate subjected to a surface treatment through laser etching, according to various embodiments.

The configuration of the processed layer provided on one surface of the glass plate in the glass plate manufacturing process of FIG. 13 and FIGS. 14A and 14B is applicable to those of the first glass plate 410 and the processed layer 470 in FIGS. 5 to 11.

Referring to FIG. 13, a processed layer (e.g., a processed surface) subjected to a surface treatment through laser etching may be provided through collision between a laser (e.g., energy) and the surface of the glass plate. The enlarged region SS of FIG. 13 illustrates the state of the processed layer magnified about 150 times.

According to an embodiment, the roughness of the processed layer (e.g., the processed surface) may be about Ra 0.2 μm (deviation: avg 0.05 μm and Max 0.1 μm). Considering that the roughness of the surface of the glass plate, on which no surface treatment has been performed, is about Ra 0.05 μm (Max 0.1 μm), an improvement is achieved in terms of the roughness to suppress a light leakage phenomenon in which the light moving inside the glass plate leaks to the outside.

According to an embodiment, the processed layer subjected to the laser etching may provide a uniform processing texture. For example, it may be confirmed that the positional deviation of the processed layer (e.g., the processed surface) is within about 2 μm, and a spot size in the processed layer (e.g., the processed surface) is within about 6 μm. Accordingly, it is possible to provide a surface of the glass plate that is strong against an external impact while suppressing a light leakage phenomenon.

Referring to FIGS. 14A and 14B and Table 1 below, experimental examples for a laser etching method capable of precise control are illustrated.

TABLE 1

| sample no. | 1 | 2 | 3 | 4 | 5 | Max. | Min. | Avr. | ± |
|---|---|---|---|---|---|---|---|---|---|
| Inner Dia. (μm) | 1498.5 | 1500.9 | 1503.2 | 1498.5 | 1500.8 | 1503.2 | 1498.5 | 1500.4 | 2.3 |
| Outer Dia. (μm) | 2009.9 | 2005.3 | 2007.7 | 2004.1 | 2007.7 | 2009.9 | 2004.1 | 2006.9 | 2.9 |

Referring to Sample Nos. 1 to 5, it can be seen that the error range of a surface treatment region through laser etching is about ±3 μm. Accordingly, the surface treatment method through laser etching can be precisely controlled, so that only a part of the curved surface of the glass plate desired by the operator can be effectively subjected to the surface treatment.

FIGS. 15A, 15B, 15C and 15D are views illustrating a side surface of a general glass plate or a glass plate having a printed layer provided thereon and a side surface of a glass plate subjected to a surface treatment according to various embodiments.

Figure 15A:
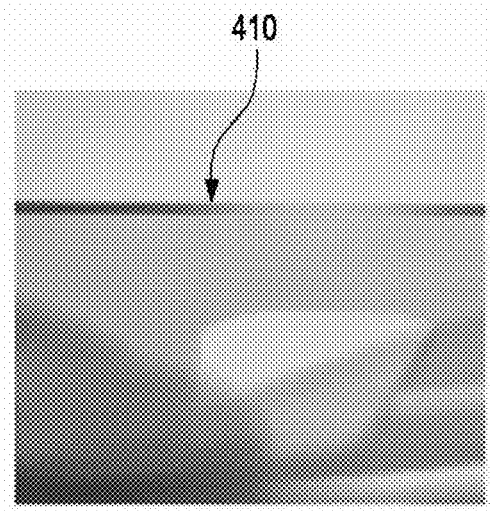
FIGS. 15A, 15B, 15C and 15D are views illustrating a side surface of a general glass plate or a glass plate having a printed layer provided thereon and a side surface of a glass plate subjected to a surface treatment according to various embodiments.
Figure 15B:
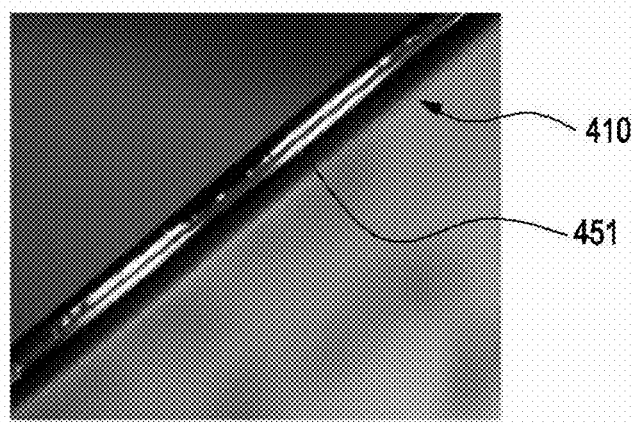

The glass plate 410 of FIGS. 15A and 15B may be the front plate (e.g., the front plate 320 in FIG. 4) or the rear plate (e.g., the rear plate 380 in FIG. 4) of the electronic device. The configuration of the processed layer 470 provided on the glass plate 410 in FIGS. 15A and 15B may be the same in whole or in part as that of the processed layer 470 of FIGS. 7 to 11.

FIG. 15A illustrates an example of a glass plate 410 on which no coating or surface treatment is performed, and FIG. 15B is an example in which a printing layer 451 is provided on one surface of the glass plate 410 through a pad printing process.

Figure 15C:
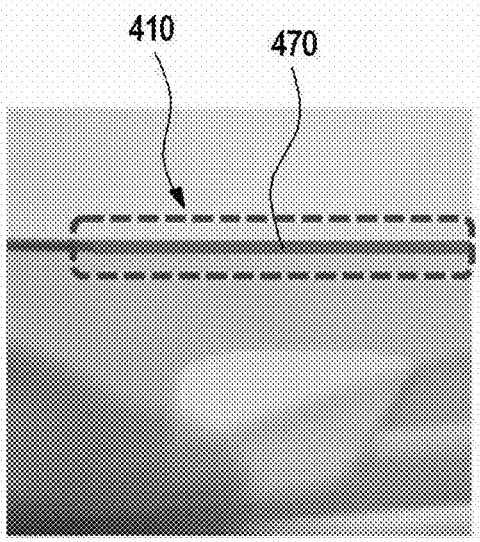
Figure 15D:
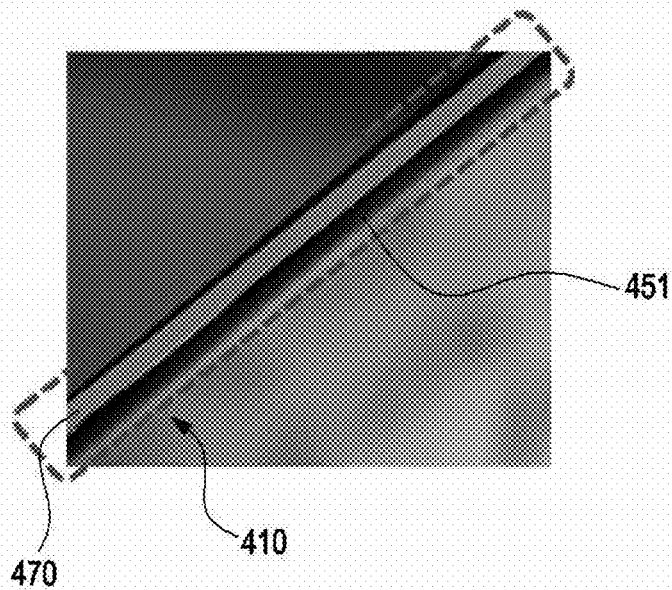

FIG. 15C illustrates an example in which a processed layer 470 is provided on one surface of an ordinary glass plate 410 by performing a surface treatment through laser etching, and FIG. 15D illustrates an example in which a processed layer 470, on which a surface treatment by laser etching has been performed, is provided together with a printed layer 451 on an ordinary glass plate 410.

Compared with FIGS. 15A and 15B, in FIGS. 15C and 15D, an improvement in terms of uniform roughness provided on the surface of the glass plate is achieved through laser etching, and the processed layer 470 can be visually observed.

An electronic device (e.g., the electronic device 101 in FIGS. 1 to 4) according to various example embodiments of the disclosure may include: a housing (e.g., 310 in FIGS. 2 and 3), a first glass plate (e.g., 410 in FIG. 7) attached to the housing to define an internal space together with the housing, an opaque layer (e.g., 430 in FIG. 7), a protective layer (e.g., 450 in FIG. 7), and a processed layer (e.g., 470 in FIG. 7). The first glass plate may include a peripheral portion adjacent to the housing, wherein the peripheral portion may include a first surface (e.g., 411 in FIG. 7) facing the internal space in a first direction (e.g., P1 in FIG. 7), a second surface (e.g., 412 in FIG. 7) extending from the first surface and facing the internal space in a second direction (e.g., P2 in FIG. 7), a third surface (e.g., 413 in FIG. 7) extending from the second surface and located adjacent to a periphery of the housing in a third direction (e.g., P3 in FIG. 7), a fourth surface (e.g., 414 in FIG. 7) extending from the third surface and facing away from the internal space in fourth direction (e.g., P4 in FIG. 7), and a fifth surface (e.g., 415 in FIG. 7) extending from the fourth surface substantially parallel to the first surface and facing away from the internal space in a fifth direction (e.g., P5 in FIG. 7). The opaque layer may be provided on the first region of the first surface to not cover the second region between the second surface and the first region, the protective layer may be provided such that at least a part of the protective layer covers a part of the first surface and the opaque layer to prevent and/or reduce an impact due to contact between the peripheral portion and the periphery of the housing, and the processed layer may be provided on at least a partial region of at least one of the second surface, the third surface, and the fourth surface through a surface treatment.

According to various example embodiments, the processed layer may include a processed surface including a substantially uniform processing texture provided by performing laser etching or sand blasting on a surface of the first glass plate.

According to various example embodiments, a positional deviation of the processed layer in thickness may be within 2 μm, and a spot size on one surface of the processed layer may be within approximately 6 μm.

According to various example embodiments, the first glass plate may include a flat portion and curved portions extending from opposite edges of the flat portion, and the peripheral portion may be a part of the curved portion.

According to various example embodiments, the first surface and the fifth surface may each include a region provided as a curved surface, and the third surface may be provided as a flat surface.

According to various example embodiments, the second surface may have a specified first inclination angle relative to the third surface, and the fourth surface may have a specified second inclination angle relative to the third surface.

According to various example embodiments, at least one of the second surface and the third surface of the first glass plate may be disposed to face and to be spaced apart from a partial region of the housing, and the protective layer, covering at least one of the second surface and the third surface, may block contact between the partial region of the housing and the second surface or the third surface.

According to various example embodiments, the processed layer, disposed to cover at least a part of a region from the second surface to the fourth surface of the first glass of the first glass plate, may be provided to prevent and/or reduce light emitted from the display from leaking out via an inside of the first glass plate and through any one of the second surface, the third surface, or the fourth surface of the peripheral portion.

According to various example embodiments, the protective layer (e.g., 450 in FIG. 7) may be disposed to extend from a region of the first surface to the second surface, and the processed layer (e.g., 470 in FIG. 7) may be provided in at least a partial region of the third surface through the laser etching.

According to various example embodiments, the protective layer (e.g., 450 in FIG. 8) may be disposed in a region of the first surface, and the processed layer (e.g., 470 in FIG. 8) may be provided from the second surface adjacent to the protective layer to at least a partial region of the third surface through the laser etching.

According to various example embodiments, the protective layer (e.g., 450 in FIG. 9) may be disposed in a region of the first surface, and the processed layer (e.g., 470 in FIG. 9) may be provided to extend from the second surface adjacent to the protective layer to at least a partial region of the fourth surface through the laser etching.

According to various example embodiments, the protective layer (e.g., 450 in FIG. 10) may extend from the first surface to be disposed up to a region of the third surface, and the processed layer (e.g., 470 in FIG. 10) may be provided to extend from an end of the protective layer provided on a region of the third surface to a partial region of the fourth surface by the laser etching.

According to various example embodiments, the protective layer (e.g., 450 in FIG. 11) may extend from the first surface to be disposed up to a partial region of the third surface, the processed layer (e.g., 470 in FIG. 11) may be provided to extend from the second surface to a partial region of the fourth surface through the laser etching, and the protective layer and the processed layer may be laminated in a region of the second region and the third region.

According to various example embodiments, the electronic device may further include a display (e.g., 330 in FIG. 6) disposed in the internal space and visible of viewable to the outside through the first glass plate.

According to various example embodiments, the electronic device may further include a second glass plate facing away from the first glass plate, and a display disposed in the internal space and visible or viewable to the outside through the second glass plate.

An electronic device (e.g., the electronic device 101 in FIGS. 1 to 4) according to various example embodiments of the disclosure may include: a housing (e.g., 310 in FIGS. 2 and 3), a first glass plate (e.g., 410 in FIG. 7) coupled to the housing to define an internal space together with the housing, an opaque layer (e.g., 430 in FIG. 7), a protective layer (e.g., 450 in FIG. 7), and a processed layer (e.g., 470 in FIG. 7). The first glass plate may include a peripheral portion adjacent the housing, and the peripheral portion may include a first surface facing the interior space, a second surface extending from an end of the first surface forming a first angle relative to the first surface, a third surface extending from an end of the second surface forming a second angle relative to the second surface and located adjacent to the periphery of the housing, a fourth surface extending from an end of the third surface forming a third angle relative to the third surface, and a fifth surface extending from an end of the fourth surface substantially parallel to the first surface and facing away from the internal space. The opaque layer may be provided on the first region of the first surface to not cover the second region between the second surface and the first region, the protective layer may be provided such that at least a part of the protective layer covers a part of the first surface and the opaque layer and the processed layer may be provided on at least a partial region of at least one of the second surface, the third surface, and the fourth surface.

According to various example embodiments, the processed layer may include a processed surface including a substantially uniform processing texture provided by performing laser etching or sand blasting on a surface of the first glass plate.

According to various example embodiments, the first, second, third, fourth and fifth directions of the first glass plate may be different from each other, and the curved portions may be provided at opposite ends located along a longitudinal direction of the first glass plate.

According to various example embodiments, the processed layer may include a first processed layer (e.g., 470a in FIG. 5A) and a second processed layer (e.g., 470b in FIG. 5A), the first processed layer may be provided at one end located along the longitudinal direction of the first glass plate, and the second processed layer may be provided at another end located along the longitudinal direction of the first glass plate.

According to various example embodiments, the processed layer may include a third processed layer (e.g., 470c in FIG. 5B) and a fourth processed layer (e.g., 470d in FIG. 5), wherein the third processed layer may extend from the first processed layer to be connected to the second processed layer and may be provided at one end located along the width direction of the first glass plate, and the fourth processed layer may extend from the second processed layer to be connected to the first processed layer and may be provided at the other end located along the width direction of the first glass plate.

It will be apparent to a person ordinarily skilled in the technical field to which the disclosure belongs that a glass plate according to various embodiment and an electronic device including the same are not limited by the above-described embodiments and drawings, and can be variously substituted, modified, and changed within the technical scope of the disclosure.

It will be further understood that any of the embodiment(s) described herein may be used in conjunction with any other embodiment(s) described herein.

What is claimed is:

1. An electronic device comprising:
   a housing;
   a first glass plate attached to the housing defining an internal space together with the housing and including a peripheral portion disposed adjacent to the housing, wherein the peripheral portion includes:
   a first surface facing the internal space in a first direction,
   a second surface extending from the first surface and facing the internal space in a second direction,
   a third surface extending from the second surface and adjacent to a periphery of the housing in a third direction,
   a fourth surface extending from the third surface and facing away from the internal space in a fourth direction, and
   a fifth surface extending from the fourth surface substantially parallel to the first surface and facing away from the internal space in a fifth direction;
   an opaque layer formed on a first region of the first surface to not cover a second region between the second surface and the first region;
   a protective layer, at least a part of which is formed to cover a part of the first surface and the opaque layer; and
   a processed layer formed on at least a partial region of at least one of the second surface, the third surface, and the fourth surface through a surface treatment,
   wherein the first glass plate includes a flat portion and curved portions extending from opposite edges of the flat portion, and the peripheral portion is a part of the red portion.

2. The electronic device of claim 1, wherein the processed layer includes a processed surface including a substantially uniform processing texture provided by performing laser etching or sand blasting on a surface of the first glass plate.

3. The electronic device of claim 2, wherein a positional deviation of the processed layer in thickness is within 2 μm, and
   a spot size on one surface of the processed layer is within approximately 6 μm.

4. The electronic device of claim 1, wherein the first surface and the fifth surface each include a region provided as a curved surface, and
   the third surface is provided as a flat surface.

5. The electronic device of claim 4, wherein the second surface forms a first inclination angle relative to the third surface, and
   the fourth surface forms a second inclination angle relative to the third surface.

6. The electronic device of claim 1, wherein at least one of the second surface and the third surface of the first glass plate is disposed to face and to be spaced apart from a partial region of the housing, and
   the protective layer covering at least one of the second surface and the third surface, is configured to block contact between the partial region of the housing and the second surface or the third surface.

7. The electronic device of claim 6, wherein the processed layer covering at least a part of a region from the second surface to the fourth surface of the first glass plate, is provided to prevent and/or reduce light emitted from the display from leaking out via an inside of the first glass plate and through any one of the second surface, the third surface, or the fourth surface of the peripheral portion.

8. The electronic device of claim 3, wherein the protective layer is disposed to extend from a region of the first surface to the second surface, and
   the processed layer is formed in at least a partial region of the third surface through the laser etching.

9. The electronic device of claim 3, wherein the protective layer is disposed on a region of the first surface, and the processed layer is formed from the second surface adjacent to the protective layer to at least a partial region of the third surface through the laser etching.

10. The electronic device of claim 3, wherein the protective layer is disposed on a region of the first surface, and
the processed layer is formed to extend from the second surface adjacent to the protective layer to at least a partial region of the fourth surface through the laser etching.

11. The electronic device of claim 3, wherein the protective layer extends from the first surface up to a region of the third surface, and
the processed layer extends from an end of the protective layer provided on a region of the third surface to a partial region of the fourth surface by the laser etching.

12. The electronic device of claim 3, wherein the protective layer extends from the first surface and is disposed up to a partial region of the third surface,
the processed layer extends from the second surface to a partial region of the fourth surface through the laser etching, and
the protective layer and the processed layer are laminated in a region of the second region and the third region.

13. The electronic device of claim 1, wherein the electronic device further includes a display disposed in the internal space and visible to the outside through the first glass plate.

14. The electronic device of claim 1, further comprising:
a second glass plate facing away from the first glass plate; and
a display disposed in the inner space and viewable to an outside through the second glass plate.

15. An electronic device comprising:
a housing;
a first glass plate coupled to the housing defining an internal space together with the housing and including a peripheral portion disposed adjacent to the housing, wherein the peripheral portion includes:
a first surface facing the internal space,
a second surface extending from an end of the first surface at a first angle relative to the first surface,
a third surface extending from an end of the second surface at a second angle relative to the second surface and located adjacent to a periphery of the housing,
a fourth surface extending from an end of the third surface at a third angle relative to the third surface, and
a fifth surface extending from an end of the fourth surface substantially parallel to the first surface, and facing away from the internal space direction;
an opaque layer provided on a first region of the first surface to not cover a second region between the second surface and the first region;
a protective layer, at least a part of which is formed to cover a part of the first surface and the opaque layer; and
a processed layer formed on at least a partial region of at least one of the second surface, the third surface, and the fourth surface,
wherein the first glass plate includes a flat portion and curved portions extending from opposite edges of the flat portion, and the peripheral portion is a part of the curved portion.

16. The electronic device of claim 15, wherein the processed layer includes a processed surface including a substantially uniform processing texture provided by performing laser etching or sand blasting on a surface of the first glass plate.

17. The electronic device of claim 15, wherein the first, second, third, fourth and fifth directions of the first glass plate are different from each other, and the curved portions is provided at opposite ends located along a longitudinal direction of the first glass plate.

18. The electronic device of claim 15, wherein the processed layer includes a first processed layer and a second processed layer, the first processed layer is provided at one end located along the longitudinal direction of the first glass plate, and the second processed layer is provided at another end located along the longitudinal direction of the first glass plate.

19. The electronic device of claim 18, wherein the processed layer includes a third processed layer and a fourth processed layer,
wherein the third processed layer extends from the first processed layer to be connected to the second processed layer and is provided at one end located along the width direction of the first glass plate, and the fourth processed layer extends from the second processed layer to be connected to the first processed layer and is provided at the other end located along the width direction of the first glass plate.

* * * * *